(12) United States Patent
Terada et al.

(10) Patent No.: US 10,930,357 B2
(45) Date of Patent: Feb. 23, 2021

(54) SEMICONDUCTOR STORAGE DEVICE HAVING A TEMPERATURE SENSOR THAT GENERATES A TEMPERATURE SIGNAL BASED ON WHICH APPLIED VOLTAGES ARE GENERATED

(71) Applicant: Toshiba Memory Corporation, Tokyo (JP)

(72) Inventors: Yuri Terada, Yokohama Kanagawa (JP); Noriyasu Kumazaki, Kawasaki Kanagawa (JP); Yasufumi Kajiyama, Kamakura Kanagawa (JP); Akio Sugahara, Yokohama Kanagawa (JP); Masahiro Yoshihara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/556,047

(22) Filed: Aug. 29, 2019

(65) Prior Publication Data

US 2020/0202957 A1 Jun. 25, 2020

(30) Foreign Application Priority Data

Dec. 20, 2018 (JP) .............................. JP2018-238706

(51) Int. Cl.

| G11C 16/30 | (2006.01) |
| G11C 16/32 | (2006.01) |
| G11C 16/10 | (2006.01) |
| G11C 16/26 | (2006.01) |
| G06F 3/06 | (2006.01) |

(Continued)

(52) U.S. Cl.
CPC ................ *G11C 16/30* (2013.01); *G01K 1/14* (2013.01); *G01K 3/10* (2013.01); *G06F 3/061* (2013.01); *G06F 3/0655* (2013.01); *G06F 3/0679* (2013.01); *G11C 16/10* (2013.01); *G11C 16/26* (2013.01); *G11C 16/32* (2013.01)

(58) Field of Classification Search
CPC ......... G11C 16/30; G11C 16/10; G11C 16/26; G11C 16/32; G01K 1/14; G01K 3/10; G06F 3/061; G06F 3/065; G06F 3/0655; G06F 3/0679
USPC ....................................................... 365/185.18
See application file for complete search history.

(56) References Cited

U.S. PATENT DOCUMENTS

| 7,447,096 B2 | 11/2008 | Riekels et al. |
| 9,368,226 B2 | 6/2016 | Chien et al. |

(Continued)

FOREIGN PATENT DOCUMENTS

| JP | 2017-084432 A | 5/2017 |
| JP | 2018-156718 A | 10/2018 |

*Primary Examiner* — Sung Il Cho
(74) *Attorney, Agent, or Firm* — Kim & Stewart LLP

(57) ABSTRACT

A semiconductor storage device includes a memory cell array, a temperature sensor configured to generate a first temperature signal corresponding to a temperature of the memory cell array in response to a first command periodically generated during a waiting period of the memory cell array, a storage circuit configured to store the first temperature signal and update the first temperature signal each time the first command is generated during the waiting period, and a voltage generation circuit configured to generate a voltage to be applied to the memory cell array based on the first temperature signal stored in the storage circuit.

8 Claims, 13 Drawing Sheets

(51) Int. Cl.
*G01K 3/10* (2006.01)
*G01K 1/14* (2021.01)

(56) References Cited

U.S. PATENT DOCUMENTS

| | | | |
|---|---|---|---|
| 9,984,731 B2 | 5/2018 | Kiyooka | |
| 10,242,745 B2 | 3/2019 | Hosoya | |
| 2007/0264942 A1* | 11/2007 | Wu | H03F 1/30 |
| | | | 455/73 |
| 2013/0227268 A1* | 8/2013 | Ichida | G06F 9/448 |
| | | | 713/100 |
| 2015/0116041 A1* | 4/2015 | Oishi | H03L 1/00 |
| | | | 331/34 |
| 2016/0087918 A1* | 3/2016 | Cheng | G06F 30/36 |
| | | | 370/400 |
| 2016/0092130 A1* | 3/2016 | Choi | G11C 11/5635 |
| | | | 711/156 |
| 2017/0125092 A1 | 5/2017 | Hirashima et al. | |
| 2018/0101204 A1* | 4/2018 | Fackenthal | G06F 3/0634 |
| 2018/0316355 A1* | 11/2018 | Yamamoto | H03L 3/00 |
| 2019/0050147 A1* | 2/2019 | Koo | G11C 7/04 |
| 2019/0317547 A1* | 10/2019 | Savoj | H03K 3/0315 |
| 2020/0132630 A1* | 4/2020 | Lee | G01N 29/036 |

\* cited by examiner

SEMICONDUCTOR STORAGE DEVICE HAVING A TEMPERATURE SENSOR THAT GENERATES A TEMPERATURE SIGNAL BASED ON WHICH APPLIED VOLTAGES ARE GENERATED

CROSS-REFERENCE TO RELATED APPLICATION

This application is based upon and claims the benefit of priority from Japanese Patent Application No. 2018-238706, filed Dec. 20, 2018, the entire contents of which are incorporated herein by reference.

FIELD

Embodiments described herein relate generally to a semiconductor storage device.

BACKGROUND

Increasing the speed of a read operation in a semiconductor storage device may be required for certain applications in which the semiconductor storage device is to be used.

DETAILED DESCRIPTION

Embodiments provide a semiconductor storage device capable of increasing the speed of a read operation.

In general, according to one embodiment, a semiconductor storage device includes a memory cell array, a temperature sensor configured to generate a first temperature signal corresponding to a temperature of the memory cell array in response to a first command periodically generated during a waiting period of the memory cell array, a storage circuit configured to store the first temperature signal and update the first temperature signal each time the first command is generated during the waiting period, and a voltage generation circuit configured to generate a voltage to be applied to the memory cell array based on the first temperature signal stored in the storage circuit.

Hereinafter, embodiments of the present disclosure will be described with reference to the drawings. The present embodiments are not for limitation purposes. The drawings are schematically or conceptually illustrated. The proportion and the like of each part are not necessarily identical to those in reality. In the specification and the drawings, the same elements as illustrated in the previous drawings will be designated by the same reference signs, and detailed descriptions of such elements will not be repeated.

First Embodiment

Figure 1:
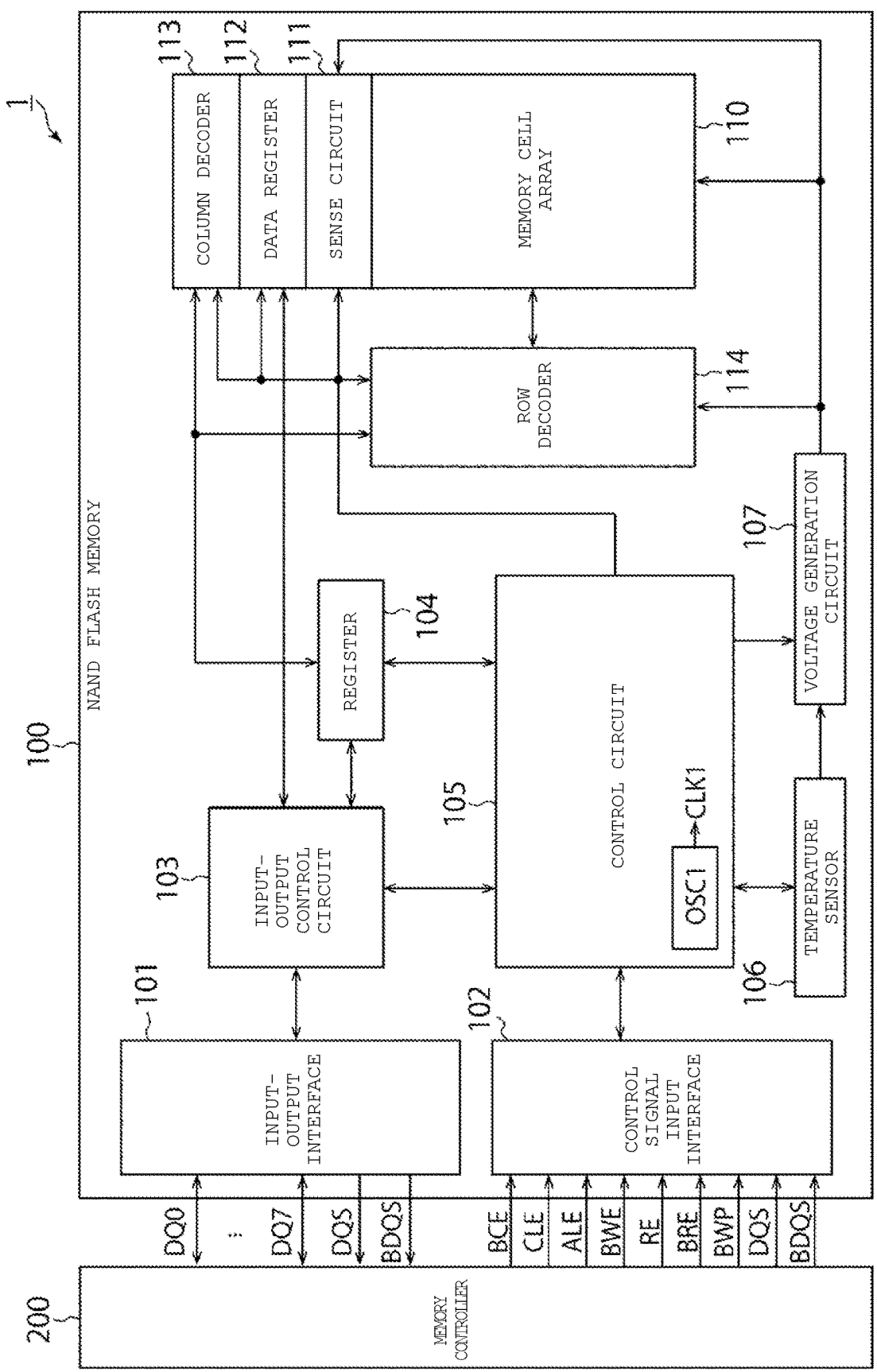
FIG. 1 is a block diagram illustrating one example of a configuration of a memory system including a semiconductor storage device according to a first embodiment.

FIG. 1 is a block diagram illustrating one example of a configuration of a memory system including a semiconductor storage device according to a first embodiment. A memory system 1 includes a NAND flash memory (which is more generally referred to as a semiconductor storage device) 100 and a memory controller 200. For example, the NAND flash memory 100 (hereinafter, referred to as the memory 100) and the memory controller 200 (hereinafter, referred to as the controller 200) in combination may constitute one semiconductor device. Examples include a memory card such as an SD® card and a solid state drive (SSD). The memory system 1 may be connected to a host device (not illustrated).

The controller 200 outputs a command and the like necessary for the operation of the memory 100 to the memory 100. By outputting the command to the memory 100, the controller 200, for example, reads data from the memory 100, writes data into the memory 100, or erases the data stored in the memory 100.

The controller 200 and the memory 100 are connected through an input-output interface 101 and a control signal input interface 102.

The input-output interface 101 generates data strobe signals DQS and BDQS (complementary signal to DQS) depending on a signal supplied from an input-output control circuit 103. When data is output from a data input-output line (DQ0 to DQ7), the input-output interface 101 outputs the data strobe signals DQS and BDQS. The memory controller 200 receives data from the data input-output line (DQ0 to DQ7) in accordance with the timings of the data strobe signals DQS and BDQS. In addition, the input-output interface 101 includes, for example, a command input terminal and an address input terminal.

The control signal input interface 102 receives a chip enable signal BCE, a command latch enable signal CLE, an address latch enable signal ALE, a write enable signal BWE, read enable signals RE and BRE (complementary signal to RE), a write protect signal BWP, and the data strobe signals DQS and BDQS (complementary signal to DQS) from the memory controller 200.

The chip enable signal BCE is used as a selection signal for the memory 100. The command latch enable signal CLE is used when an operation command is retrieved into a register 104. The address latch enable signal ALE is used when address information or input data is retrieved into the register 104. The write enable signal BWE is used for retrieving a command, an address, and data in the input-output interface 101 into the memory 100. The read enable signals RE and BRE are used when data is serially output from the input-output interface 101. The write protect signal BWP is used for protecting data from an unexpected erase or write operation when the memory 100 is powered up or an input signal is not determined as in power-down or the like.

While not illustrated in FIG. 1, R/B terminals showing an internal operation state of the NAND flash memory 100, Vcc/Vss/Vccq/Vssq terminals for power supply, and the like are also disposed in the NAND flash memory 100.

The input-output control circuit 103 outputs data read from a memory cell array 110 through the input-output interface 101 to the memory controller 200. The input-output control circuit 103 receives various commands such as a write command, a read command, an erase command, and a status read command, an address, and write data through the control signal input interface 102 and a control circuit 105.

The control circuit 105 supplies a control signal input through the control signal input interface 102 to the input-output control circuit 103. The control circuit 105 controls a temperature sensor 106, a voltage generation circuit 107, a sense circuit 111, a data register 112, a column decoder 113, a row decoder 114, and the register 104.

The control circuit 105 operates depending on the control signal and a command input through the command register 104. When data is programmed, verified, read, or erased, the control circuit 105 supplies a desired voltage to the memory cell array 110, the sense circuit 111, and the row decoder 114 using the voltage generation circuit 107.

The control circuit 105 includes an oscillator OSC1 as a first clock generation unit and generates a clock used for operating the memory cell array 110. For example, the oscillator OSC1 starts up when receiving the chip enable signal BCE through the control signal input interface 102 and starts generating the clock. Based on the clock from the oscillator OSC1, the voltage generation circuit 107 applies a voltage to the memory cell array 110 and, for example, may program, verify, read, and/or erase data. That is, the oscillator OSC1 does not generate the clock in a waiting state (ready state) during which the memory 100 is not selected. When the memory 100 is selected and enters a start-up state (busy state), the oscillator OSC1 starts generating the clock.

Each of the input-output control circuit 103 and the control circuit 105 is described in functional terms in the present embodiment. The functions of the input-output control circuit 103 and the control circuit 105 may be implemented in hardware or software.

The register 104 outputs a command input from the input-output control circuit 103 to the control circuit 105. For example, the register 104 latches an address supplied from the memory controller 200. The register 104 converts the latched address into an internal physical address (a column address and a row address). The register 104 supplies the column address to the column decoder 113 and supplies the row address to the row decoder 114.

The register 104 is used for notifying various states in the memory 100 to the outside of the memory 100. The register 104 includes a ready/busy register that stores data indicating whether the memory 100 is in a ready/busy state and a write status register (not illustrated) that stores data indicating a write operation pass or fail.

The temperature sensor 106 measures the temperature of the memory 100 based on an instruction from the control circuit 105 and generates a temperature code corresponding to the temperature of the memory 100. The temperature sensor 106 supplies a voltage generation signal TOUT based on the temperature code to the voltage generation circuit 107. The voltage generation circuit 107 generates various voltages based on the voltage generation signal TOUT. In the present embodiment, the temperature sensor 106 generates the temperature code regardless of an access operation such as a write operation to the memory cell array 110, a read operation from the memory cell array 110, and an erasing operation of the memory cell array 110. That is, either during a period of access to the memory cell array 110 (busy state) or during a waiting period in which the memory cell array 110 is not accessed (ready state), the temperature sensor 106 periodically generates the temperature code (referred to as a temperature signal) corresponding to the temperature of the memory cell array 110. The temperature sensor 106 will be described in detail below.

The memory cell array 110 includes a plurality of bit lines BL, a plurality of word lines WL, and a source line SL. The memory cell array 110 is configured with a plurality of blocks BLK in which electrically rewritable memory cell transistors (simply referred to as memory cells) MC are arranged in a matrix configuration. For example, the memory cell MC includes a gate stack including a control gate electrode and a charge storage layer (for example, a floating gate electrode) and stores binary or multi-value data depending on a change in threshold voltage of the transistor determined by the amount of charges injected in the floating gate electrode. That is, the memory cell MC may be a single level cell (SLC) or a multi-level cell (MLC). In addition, the memory cell MC may have a metal-oxide-nitride-oxide-silicon (MONOS) structure in which electrons are trapped in a nitride film.

The memory cell array 110 may have a configuration other than the above configuration, such as the configurations disclosed in U.S. patent application Ser. No. 12/407,403 entitled "THREE DIMENSIONAL STACKED NON-VOLATILE SEMICONDUCTOR MEMORY" filed on Mar. 19, 2009, U.S. patent application Ser. No. 12/406,524 entitled "THREE DIMENSIONAL STACKED NON-VOLATILE SEMICONDUCTOR MEMORY" filed on Mar. 18, 2009, U.S. patent application Ser. No. 12/679,991 entitled "NONVOLATILE SEMICONDUCTOR MEMORY DEVICE AND METHOD OF MANUFACTURING THE SAME" filed on Mar. 25, 2010, U.S. patent application Ser. No. 13/816,799 entitled "NONVOLATILE SEMICONDUCTOR MEMORY DEVICE" filed on Sep. 22, 2011, and U.S. patent application Ser. No. 12/532,030 entitled "SEMICONDUCTOR MEMORY AND METHOD FOR MANUFACTURING THE SAME" filed on Mar. 23, 2009. The entire contents of all of these patent applications are incorporated in the present specification by reference.

In addition, for example, the configuration of the memory cell array 110 may have a configuration disclosed in U.S. patent application Ser. No. 12/397,711 entitled "SEMICONDUCTOR MEMORY DEVICE HAVING PLURALITY OF TYPES OF MEMORIES INTEGRATED ON ONE CHIP" filed on Mar. 3, 2009, U.S. patent application Ser. No. 13/451,185 entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE" filed on Apr. 19, 2012, U.S. patent application Ser. No. 12/405,626 entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT" filed on Mar. 17, 2009, and U.S. patent application Ser. No. 09/956,986 entitled "NONVOLATILE SEMICONDUCTOR MEMORY DEVICE HAVING ELEMENT ISOLATING REGION OF TRENCH TYPE AND METHOD OF MANUFACTURING THE SAME" filed on Sep. 21, 2001. The entire contents of all of these patent applications are incorporated in the present specification by reference.

The sense circuit 111 senses data read into the bit line from the memory cell MC when a data read operation is performed.

The data register 112 is configured with an SRAM or the like. The data register 112 stores data supplied from the memory controller 200, a verification result detected by the sense circuit 111, and the like.

The column decoder 113 decodes the column address signal and outputs a selection signal for selecting any bit line BL to the sense circuit 111.

The row decoder 114 decodes the row address signal. The row decoder 114 selects and drives the word line WL and select gate lines SGD and SGS of the memory cell array 110.

Figure 2:
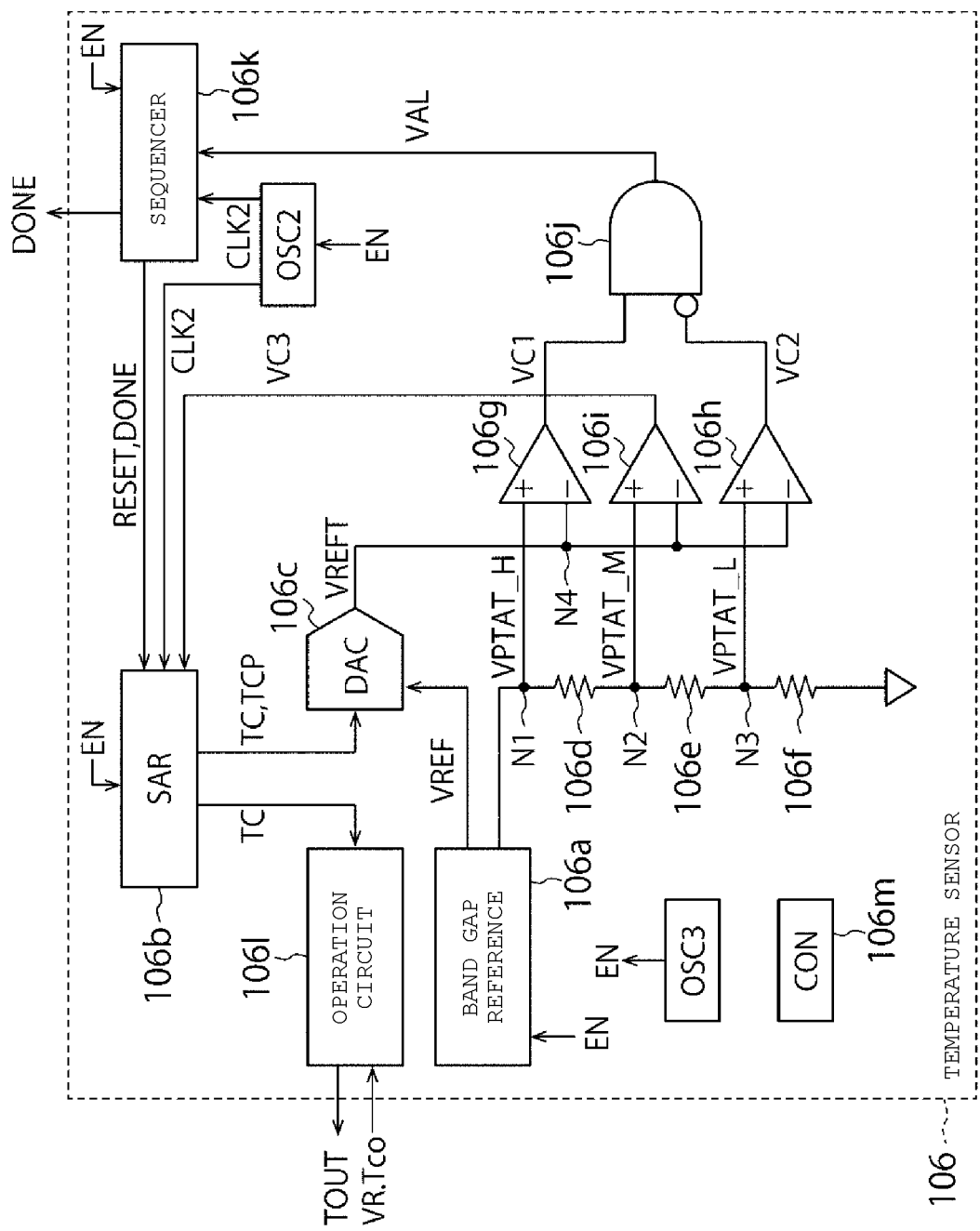
FIG. 2 is a block diagram illustrating one example of a configuration of a temperature sensor.

FIG. 2 is a block diagram illustrating one example of a configuration of the temperature sensor 106. The temperature sensor 106 includes a band gap reference circuit 106a, a successive approximation register (SAR) 106b, a digital-to-analog conversion circuit (DAC) 106c, resistor elements 106d, 106e, and 106f, voltage comparison circuits 106g, 106h, and 106i, an AND operation circuit 106j, a sequencer 106k, an operation circuit 106l, oscillators OSC2 and OSC3, and a control circuit 106m.

The band gap reference circuit (hereinafter, referred to as the BGR circuit) 106a includes, for example, a diode. When the BGR circuit 106a receives an enable signal EN at "high (H)" level from the control circuit 105, the BGR circuit 106a generates a reference voltage VREF and a voltage VPTAT_H proportional to the absolute temperature of the memory 100. The reference voltage VREF is not proportional to the temperature.

The temperature sensor 106 includes the oscillator OSC2 as a second clock generation unit and the oscillator OSC3 as a third clock generation unit separately from the oscillator OSC1 in the control circuit 105 in FIG. 1. The oscillator OSC2 generates a second clock signal CLK2 in order to generate a voltage code based on the temperature. The oscillator OSC2 may have the same configuration as the oscillator OSC1 and generates the clock signal CLK2 having the same cycle time as a clock signal CLK1 from the oscillator OSC1. The oscillator OSC2 starts up by receiving the enable signal EN from the oscillator OSC3 and starts generating the second clock signal CLK2. The oscillator OSC3 is used for generating the enable signal EN as a first command for driving the whole temperature sensor 106. The enable signal EN from the oscillator OSC3 is a clock signal having a longer cycle time than the clock signals CLK1 and CLK2 from the oscillators OSC1 and OSC2. For example, the clock signals CLK1 and CLK2 have a few tens of ns cycle time, and the enable signal EN from the oscillator OSC3 is a clock signal having a few ms cycle time. That is, the cycle time of the enable signal EN from the oscillator OSC3 is approximately hundred to thousand times the cycle times of the clock signals CLK1 and CLK2. The configuration of the oscillator OSC3 will be described in detail below. The enable signal EN may be emitted from not only the oscillator OSC3 but also the control circuit 105 in FIG. 1 when the memory 100 enters the busy state.

The successive approximation register 106b starts operating when receiving the enable signal EN at "H" level from the control circuit 105 or the oscillator OSC3. Furthermore, the successive approximation register 106b operates in accordance with the timing (for example, a rising edge) of the clock signal CLK2 received from the oscillator OSC2. When the successive approximation register 106b receives the enable signal EN from the control circuit 105 or the oscillator OSC3, the successive approximation register 106b supplies a temperature code TC (temperature signal) stored as a digital value to the digital-to-analog conversion circuit 106c. When the successive approximation register 106b receives a reset signal RESET from the sequencer 106k, the successive approximation register 106b performs an update operation (referred to as a sampling operation) of the temperature code for determining the most recent temperature code. When the successive approximation register 106b receives a completion notification signal DONE from the sequencer 106k, or the sampling operation is complete, the successive approximation register 106b supplies the stored temperature code TC to the operation circuit 106l. The successive approximation register 106b basically stores the most recent temperature code TC.

The oscillators OSC2 and OSC3 are disposed separately from the oscillator OSC1. Thus, the temperature sensor 106 can operate separately from the operation of the control circuit 105. Accordingly, even when the memory cell array 110 is in the ready state, the temperature sensor 106 can generate the temperature code based on the enable signal EN periodically (for example, for every few ms) generated by oscillator OSC3. At this point, the temperature sensor 106 generates the temperature code by sampling the temperature of the memory 100 in accordance with the clock signal CLK2 from the oscillator OSC2.

The voltage generation signal TOUT from the temperature sensor 106 comprises digital data representing the temperature of the memory cell array 110 or the temperature around the memory cell array 110. Accordingly, the voltage generation circuit 107 can change various voltages to be applied to the memory cell array 110 depending on the temperature of the memory cell array 110. For example, the threshold voltage of the memory cell MC changes depending on the temperature. Thus, in the data read operation, the voltage generation circuit 107 generates a voltage to be applied to the word line in accordance with the temperature characteristics of the threshold voltage of the memory cell MC. Accordingly, even when the temperature of the memory cell array 110 changes, the sense circuit 111 can accurately read data stored in the memory cell MC.

The digital-to-analog conversion circuit 106c converts the temperature code TC into a voltage. Specifically, the digital-to-analog conversion circuit 106c generates a second reference voltage VREFT based on the reference voltage VREF and the temperature code TC. The second reference voltage VREFT is proportional to the temperature code TC.

In the voltage comparison circuit 106g, the voltage VPTAT_H is supplied to a non-inverting terminal through a node N1, and the voltage VREFT is supplied to an inverting terminal through a node N4. When the voltage VPTAT_H is higher than the voltage VREFT, the voltage comparison circuit 106g outputs a signal VC1 at "H" level. When the voltage VPTAT_H is lower than the voltage VREFT, the voltage comparison circuit 106g outputs the signal VC1 at "low (L)" level (L<H).

The resistor element 106d is connected to the node N1 at one end and is connected to a node N2 at another end. The resistance value and the like of the resistor element 106d will be described below.

In the voltage comparison circuit 106i, a voltage VPTAT_M (VPTAT_M<VPTAT_H) is supplied to a non-inverting terminal through the node N2, and the voltage VREFT is supplied to an inverting terminal through the node N4. When the voltage VPTAT_M is higher than the voltage VREFT, the voltage comparison circuit 106i outputs a signal VC3 at "H" level. When the voltage VPTAT_M is lower than the voltage VREFT, the voltage comparison circuit 106i outputs the signal VC3 at "L" level.

The resistor element 106e is connected to the node N2 at one end and is connected to a node N3 at another end. The resistance value and the like of the resistor element 106e will be described below.

In the voltage comparison circuit 106h, a voltage VPTAT_L (VPTAT_L<VPTAT_M) is supplied to a non-inverting terminal through the node N3, and the voltage VREFT is supplied to an inverting terminal through the node N4. When the voltage VPTAT_L is higher than the voltage VREFT, the voltage comparison circuit 106h outputs a signal VC2 at "H" level. When the voltage VPTAT_L is lower than the voltage VREFT, the voltage comparison circuit 106h outputs the signal VC2 at "L" level.

The resistor element 106f is connected to the node N3 at one end and is connected to a ground potential VSS at another end.

In the AND operation circuit 106j, the signal VC1 is input into a non-inverting terminal, and the signal VC2 is input into an inverting terminal. The AND operation circuit 106j outputs a signal VAL at "H" level only when the signal VC1 is at "H" level and the signal VC2 is at "L" level. Otherwise, the AND operation circuit 106j outputs the signal VAL at "L" level.

The sequencer 106k operates when receiving the enable signal EN at "H" level from the control circuit 105 or the oscillator OSC3. Furthermore, the sequencer 106k operates in accordance with the timing (for example, a rising edge) of the clock signal CLK2 received from the oscillator OSC2. When the sequencer 106k receives the signal VAL at "H" level, the sequencer 106k supplies the completion notification signal DONE to the control circuit 105. When the sequencer 106k receives the signal VAL at "L" level, the sequencer 106k supplies the reset signal RESET to the successive approximation register 106b.

The operation circuit 106l generates the voltage generation signal TOUT based on the temperature code TC supplied from the successive approximation register 106b, a voltage code VR, and a temperature coefficient Tco. The operation circuit 106l derives the voltage generation signal TOUT using an expression "voltage generation signal TOUT=voltage code VR+temperature coefficient Tco*temperature code TC".

Figure 3:
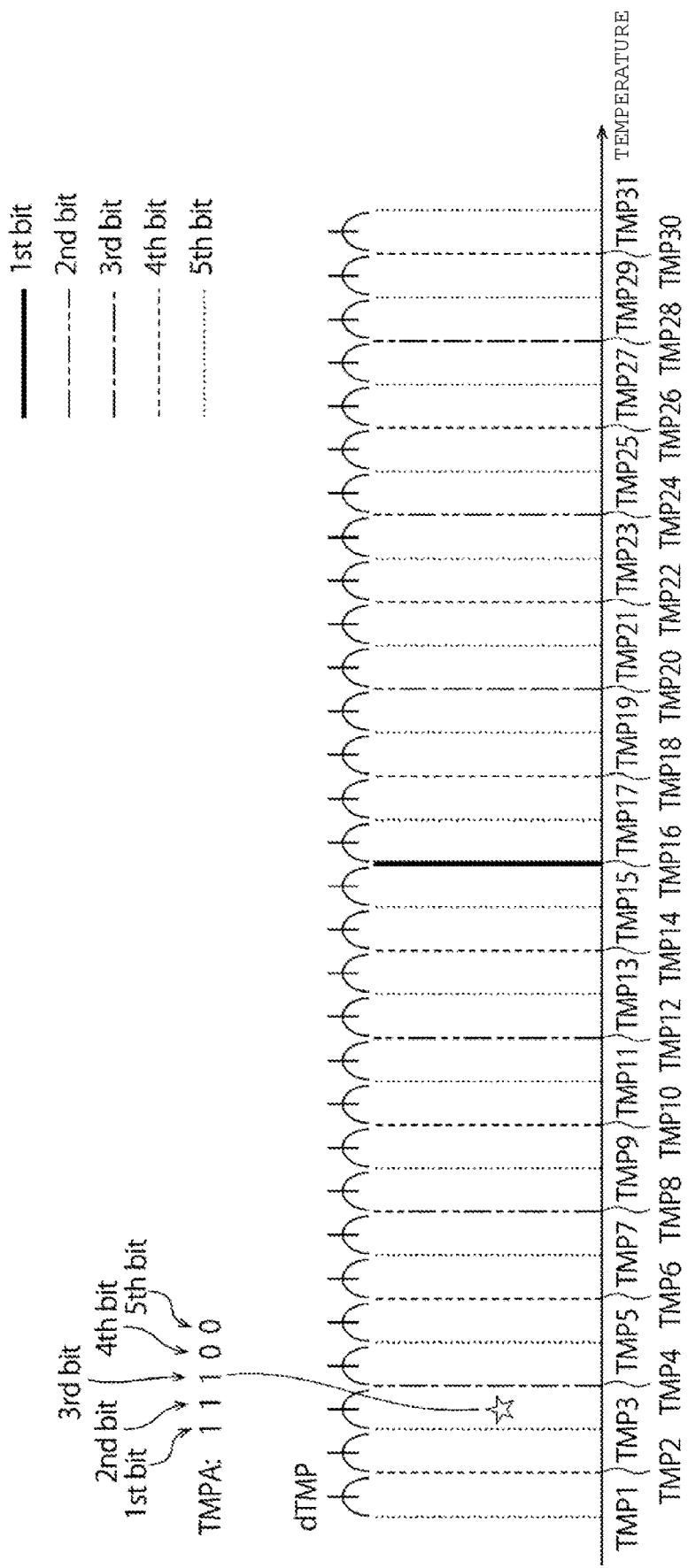
FIG. 3 is a conceptual diagram illustrating a temperature code.

FIG. 3 is a conceptual diagram illustrating the temperature code TC. The temperature sensor 106 converts the temperature of the memory 100 into digital data of n bits (where n is any integer greater than or equal to one). The digital data is the temperature code. For example, the temperature sensor 106 converts the temperature into the digital data using a successive approximation register (SAR) method. A case where the temperature code corresponds to 5 bits of digital data will be described as one example.

When the temperature code is 5 bits in size, the temperature may be determined by dividing the temperature into 32 temperatures as illustrated in FIG. 3.

The first bit (1st bit) determines the magnitude of a temperature TMP16. For example, the first bit is "1" when the temperature of the memory 100 is lower than the temperature TMP16. In addition, the first bit is "0" when the temperature of the memory 100 is higher than the temperature TMP16.

The second bit (2nd bit) determines the magnitude of a temperature TMP8 or a temperature TMP24. For example, the second bit is "1" when the temperature of the memory 100 is lower than the temperature TMP8 or the temperature TMP24. In addition, the second bit is "0" when the temperature of the memory 100 is higher than the temperature TMP8 or the temperature TMP24.

The third bit (3rd bit) determines the magnitude of one temperature selected from a temperature TMP4, a temperature TMP12, a temperature TMP20, and a temperature TMP28. For example, the third bit is "1" when the temperature of the memory 100 is lower than one temperature selected from the temperature TMP4, the temperature TMP12, the temperature TMP20, and the temperature TMP28. In addition, the third bit is "0" when the temperature of the memory 100 is higher than one temperature selected from the temperature TMP4, the temperature TMP12, the temperature TMP20, and the temperature TMP28.

The fourth bit (4th bit) determines the magnitude of one temperature selected from a temperature TMP2, a temperature TMP6, a temperature TMP10, a temperature TMP14, a temperature TMP18, a temperature TMP22, a temperature TMP26, and a temperature TMP30. For example, the fourth bit is "1" when the temperature of the memory 100 is lower than one temperature selected from the temperature TMP2, the temperature TMP6, the temperature TMP10, the temperature TMP14, the temperature TMP18, the temperature TMP22, the temperature TMP26, and the temperature TMP30. In addition, the fourth bit is "0" when the temperature of the memory 100 is higher than one temperature selected from the temperature TMP2, the temperature TMP6, the temperature TMP10, the temperature TMP14, the temperature TMP18, the temperature TMP22, the temperature TMP26, and the temperature TMP30.

The fifth bit (5th bit) determines the magnitude of one temperature selected from a temperature TMP1, a temperature TMP3, a temperature TMP5, a temperature TMP7, a temperature TMP9, a temperature TMP11, a temperature TMP13, a temperature TMP15, a temperature TMP17, a temperature TMP19, a temperature TMP21, a temperature TMP23, a temperature TMP25, a temperature TMP27, a temperature TMP29, and a temperature TMP31. For example, the fifth bit is "1" when the temperature of the memory 100 is lower than one temperature selected from the temperature TMP1, the temperature TMP3, the temperature TMP5, the temperature TMP7, the temperature TMP9, the temperature TMP11, the temperature TMP13, the temperature TMP15, the temperature TMP17, the temperature TMP19, the temperature TMP21, the temperature TMP23, the temperature TMP25, the temperature TMP27, the temperature TMP29, and the temperature TMP31. In addition, the fifth bit is "0" when the temperature of the memory 100 is higher than one temperature selected from the temperature TMP1, the temperature TMP3, the temperature TMP5, the temperature TMP7, the temperature TMP9, the temperature TMP11, the temperature TMP13, the temperature TMP15, the temperature TMP17, the temperature TMP19, the temperature TMP21, the temperature TMP23, the temperature TMP25, the temperature TMP27, the temperature TMP29, and the temperature TMP31.

A voltage changes in proportion to the temperature of the memory 100. Therefore, the temperature sensor 106 determines the temperature based on the voltage changing depending on the temperature.

A method of the sampling operation when the temperature of the memory 100 is equal to a temperature TMPA will be schematically described with reference to FIG. 3. At the time of the sampling operation, the successive approximation register 106b causes the digital-to-analog conversion circuit 106c to generate a voltage based on the temperature TMP16. As illustrated in FIG. 3, the temperature TMPA is lower than the temperature TMP16. Thus, the signal VC3 at "H" level is supplied to the successive approximation register 106b. Accordingly, the successive approximation register 106b determines that the first bit is "1". Since it is determined that the first bit is "1", the successive approximation register 106b compares the magnitudes of the temperature TMPA and the temperature TMP8. The temperature TMPA is lower than the temperature TMP8. Thus, the successive approximation register 106b determines that the second bit is "1". Since it is determined that the first bit and the second bit are "1", the successive approximation register 106b compares the magnitudes of the temperature TMPA and the temperature TMP4. The temperature TMPA is lower than the temperature TMP4. Thus, the successive approximation register 106b determines that the third bit is "1". Since it is determined that the first bit to the third bit are "1", the successive approximation register 106b compares the magnitudes of the temperature TMPA and the temperature TMP2. The temperature TMPA is higher than the temperature TMP2. Thus, the successive approximation register 106b determines that the fourth bit is "0". Since it is determined that the first bit to the third bit are "1" and the fourth bit is "0", the successive approximation register 106b compares the magnitudes of the temperature TMPA and the temperature TMP3. The temperature TMPA is higher than the temperature TMP3. Thus, the successive approximation register 106b determines that the fifth bit is "0". In this manner, the successive approximation register 106b determines that the temperature TMPA is between the temperature TMP3 and the temperature TMP4. As a result of the determination, the successive approximation register 106b can obtain a digital code "11100" as the temperature code. The method of the sampling operation when the temperature of the memory 100 is equal to a temperature TMPB will not be described. The temperatures TMP1 to TMP31 are set at equal intervals (dTMP).

As described thus far, the temperature sensor 106 measures the temperature of the memory 100 and controls the voltage generation circuit 107 to generate a voltage corresponding to the temperature. The voltage generation circuit 107 generates various voltages to be applied to the memory cell array 110 based on the voltage generation signal TOUT from the temperature sensor 106. For example, in the data read operation, the voltage generation circuit 107 sets a word line voltage to be a voltage corresponding to the voltage generation signal TOUT. Accordingly, even when the temperature of the memory cell array 110 changes, the sense circuit 111 can accurately read data stored in the memory cell MC.

It is desirable to reduce the amount of time for obtaining the temperature code TC in order to increase the speed of the operation of the memory 100. For example, in a low latency NAND flash memory used in a storage or a cache memory, it is desirable to reduce the amount of time for obtaining the temperature code while maintaining the accuracy of the temperature in a NAND flash memory in the related art. The amount of time for obtaining the temperature code TC is gradually reduced from that in the related art, but is still a few µs. That is, it takes a few µs to update the temperature code TC stored in the successive approximation register (SAR) 106b in FIG. 2.

When the temperature code is updated in accordance with only the clock from the oscillator OSC1, the temperature code is updated after the memory enters the busy state. The reason is that the oscillator OSC1 starts generating the clock after the memory is selected and enters the busy state. In this case, in the read operation, the voltage generation circuit 107 cannot determine the word line voltage until the temperature code of the successive approximation register 106b is updated. That is, the memory cannot execute the data read operation until the temperature code of the successive approximation register 106b is obtained. For example, when the amount of time for obtaining the temperature code TC is a few µs, a voltage cannot be applied to the word line, and the sense circuit 111 cannot detect data before an elapse of a few µs after the memory receives the read enable signal RE and enters the busy state.

Meanwhile, the memory 100 according to the present embodiment includes the oscillators OSC2 and OSC3 disposed separately from the oscillator OSC1. The oscillator OSC2 is disposed in the temperature sensor 106 in order to operate the temperature sensor 106. The oscillator OSC2 may have the same configuration as the oscillator OSC1. By providing the oscillator OSC2 and the oscillator OSC3 separately from the oscillator OSC1, the temperature sensor 106 can generate the temperature code based on the periodically generated enable signal EN even when the memory 100 is in the ready state.

Figure 4:
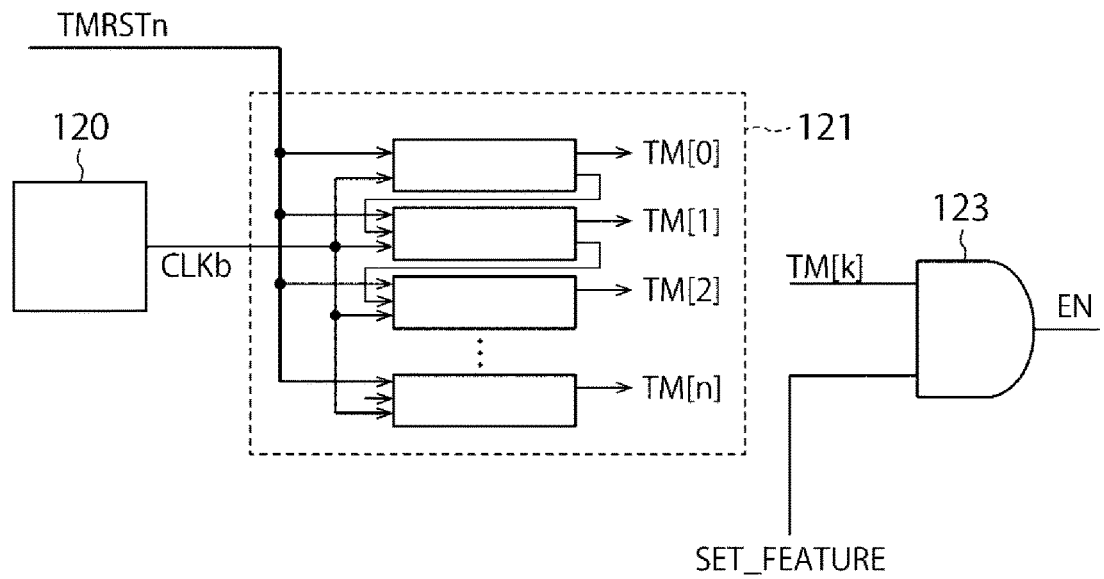
FIG. 4 is a block diagram illustrating one example of a configuration of an oscillator of the temperature sensor.

FIG. 4 is a block diagram illustrating one example of a configuration of the oscillator OSC3 of the temperature sensor 106. The configuration of the oscillator OSC2 is the same as the configuration of the oscillator OSC1 in FIG. 1 and thus, will not be repeated.

The oscillator OSC3 includes a base oscillator 120, a refresh counter 121, and an operation circuit 123. The base oscillator 120 generates a base clock signal CLKb having any cycle time shorter than the cycle time of the enable signal EN. The refresh counter 121 includes a plurality of flip-flops FF0 to FFn (n is an integer greater than or equal to 1) and divides the base clock signal CLKb. The flip-flop FF0 outputs a clock having a cycle time twice as long as the base clock signal CLKb (division ratio of 2), and FF1 outputs a clock having a cycle time four times longer than the base clock signal CLKb (division ratio of 4). In this manner, the flip-flop FFk (0≤k≤n) outputs a clock having a cycle time 2(k+1) times longer than the base clock signal CLKb (division ratio of 2 (k+1)). That is, outputs TM[0] to TM[n] of the flip-flops FF0 to FFn are clocks having cycle times twice to 2(n) times longer than the cycle time of the base clock signal CLKb.

The operation circuit 123 receives the output TM[k] (any of the outputs TM[0] to TM[n]) of the flip-flop FFk and a SET_FEATURE signal and outputs the logical product of the output TM[k] and the SET_FEATURE signal. The SET_FEATURE signal indicates that the memory 100 is ready to receive a command. The SET_FEATURE signal rises after power-up, and the state where the SET_FEATURE signal rises is maintained until power-down. The base oscillator 120 starts up by power-up and continuously outputs the base clock signal CLKb. The base oscillator 120 continues outputting the base clock signal CLKb until the memory 100 is powered down. Accordingly, the operation circuit 123 continues outputting the output TM[k] after the rise of the SET_FEATURE signal unless the memory 100 is powered down.

The output TM[k] is freely set depending on the rising cycle of the enable signal EN (that is, the drive cycle of the temperature sensor 106). As will be described below, a change in temperature of the memory cell array 110 depends on material constituting the memory cell array 110 or a guaranteed temperature range of an environment in which the memory cell array 110 is used. The smallest change in temperature of the memory cell array 110 is approximately a few tens of ms/1° C. to a few hundred ms/1° C. That is, in order to guarantee that the temperature code is updated when the temperature of the memory cell array 110 changes by 1° C., the temperature code may be updated for at least every few tens of ms. Accordingly, for example, when the rising cycle of the enable signal EN is set to approximately 5 ms, the output TM[k] having a cycle time close to 5 ms is selected and is input into the operation circuit 123. For example, the output TM[k] can be selected by transmitting a command set for setting the characteristics of the NAND flash memory 100 from the memory controller 200. In this manner, the oscillator OSC3 can output the enable signal EN having any suitable cycle time.

Figure 5:
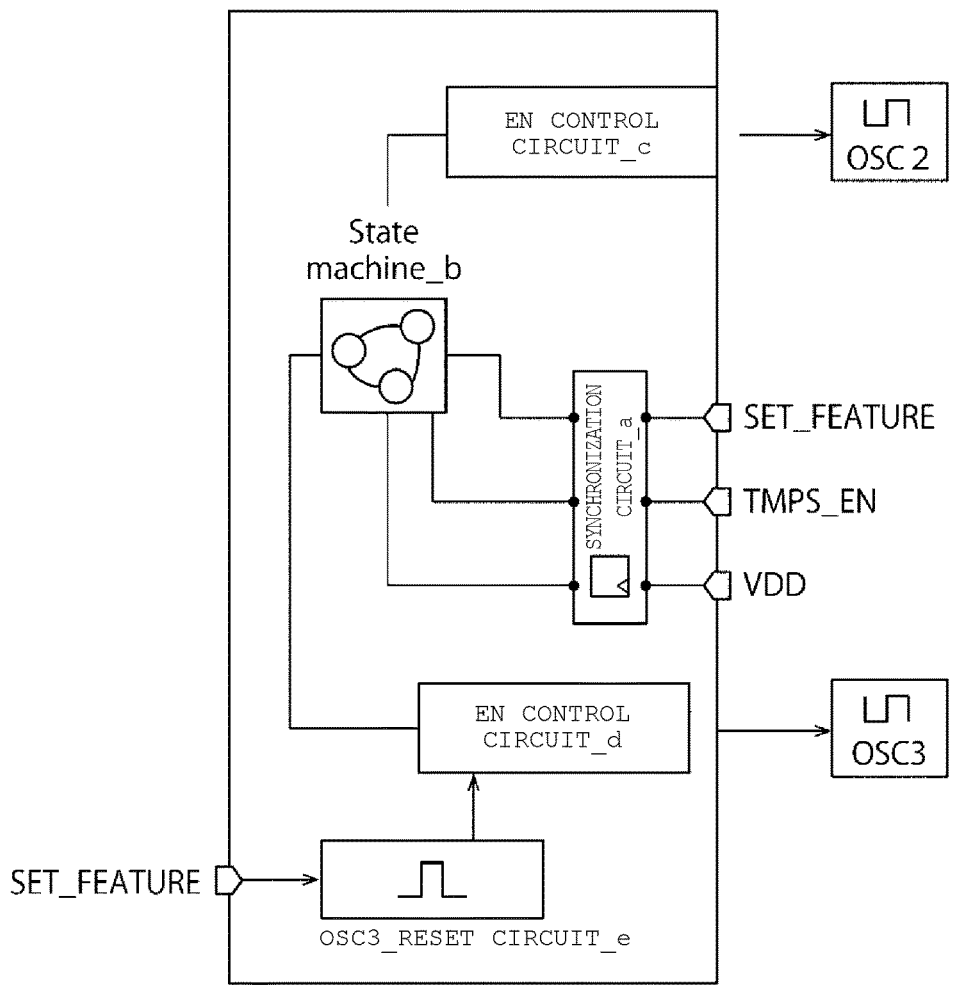
FIG. 5 is a block diagram illustrating one example of a configuration of a control circuit.

FIG. 5 is a block diagram illustrating one example of a configuration of the control circuit 106m. Control circuits controlling the oscillators OSC2 and OSC3 are denoted by EN control circuit_c and EN control circuit_d. EN control circuit_c and EN control circuit_d are driven at individual timings in the temperature sensor 106 and thus, receive individual signals from the input-output control circuit 103 in FIG. 1. In addition, when a signal is returned to the input-output control circuit 103, the signal needs to be synchronized with the input-output control circuit 103. Thus, synchronization circuit_a returns the signal to the input-output control circuit 103. EN control circuit_c and EN control circuit_d are mainly implemented by flip-flops which are connected in a cascade manner. In a state machine, EN control circuit_c and EN control circuit_d are logic control units determining whether OSC2 and OSC3 are ready or busy. In addition, reset circuit_e having a long cycle count for not driving OSC3 immediately after the busy state is disposed in the control circuit 106m.

Figure 6:
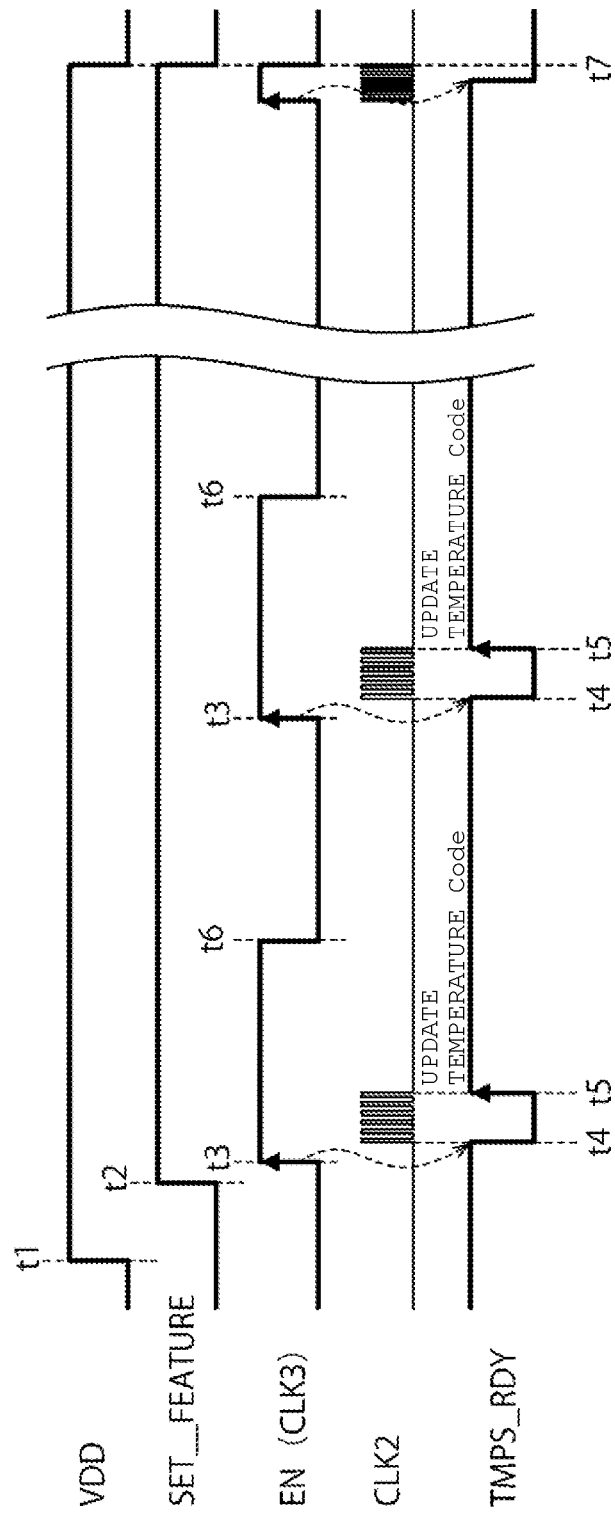
FIG. 6 is a timing chart illustrating one example of the operation of the temperature sensor.

FIG. 6 is a timing chart illustrating one example of the operation of the temperature sensor 106.

First, at t1, a power supply voltage VDD is supplied.

Next, at t2, the SET_FEATURE signal rises. Accordingly, the whole memory 100 can receive a command. The memory 100 is in a waiting state (ready state) where a command is not received yet. When the memory 100 receives a command from the memory controller 200, the memory 100 enters the busy state. In FIG. 6, only the period of the ready state is illustrated, and the busy state is not illustrated.

Next, at t3, the oscillator OSC3 starts up and starts outputting the enable signal EN. For example, the enable signal EN rises at a cycle time of a few ms.

When the enable signal EN rises at t3, the temperature sensor 106 starts up at t4, and the oscillator OSC2 starts outputting the clock signal CLK2. The clock signal CLK2 operates the sequencer 106k and the successive approximation register 106b, and the temperature code corresponding to the temperature of the memory cell array 110 at the time of the operation of the sequencer 106k and the successive approximation register 106b is obtained.

In addition, when the enable signal EN rises, a signal TMPS_RDY falls at t4. The signal TMPS_RDY indicates the busy state of the temperature sensor 106. When the signal TMPS_RDY is low, the signal TMPS_RDY indicates that the temperature sensor 106 is in the busy state and indicates that the temperature code is being generated by measuring the temperature of the memory cell array 110. When the signal TMPS_RDY is high, the signal TMPS_RDY indicates that the temperature sensor 106 is in the ready state, and the enable signal EN and the like can be received (waiting state).

At t4 to t5, the temperature sensor 106 is in the busy state, and the sequencer 106k and the successive approximation register 106b generate the temperature code.

At t5, when the temperature code is generated, the signal TMPS_RDY rises, and the temperature code stored in the successive approximation register 106b is updated. Hereinafter, an operation of updating the temperature code will be referred to as a "refresh" of the temperature code. In addition, hereinafter, an operation of automatically updating the temperature code at each rise of the enable signal EN even in the ready state will be referred to as an "auto-refresh" of the temperature code.

By the operation of refreshing the temperature code, the voltage generation circuit 107 in FIG. 1 can set various voltages to be applied to the memory cell array 110 using the updated temperature code. For example, in the data read operation, the voltage generation circuit 107 sets the voltage applied to the word line to be a voltage corresponding to the temperature code. Accordingly, the sense circuit 111 can accurately detect data stored in the memory cell MC using the word line voltage corresponding to the temperature of the memory cell array 110.

Next, at t6, the enable signal EN falls, and the temperature sensor 106 enters the ready state.

During a period in which the power supply voltage VDD is supplied and the SET_FEATURE signal rises, the auto-refresh (t3 to t6) of the temperature code is repeatedly executed. The auto-refresh of the temperature code may be executed only when the memory 100 is in the ready state or may be executed during a period in which the memory 100 is in any of the ready state and the busy state.

Then, at t7, when the power is down, the auto-refresh of the temperature code stops. In this case, the auto-refresh is stopped even in the middle of the auto-refresh of the temperature code.

According to the present embodiment, the temperature sensor 106 includes the oscillators OSC2 and OSC3 separately from the oscillator OSC1 of the control circuit 105 in FIG. 1. Even when the memory 100 is in the ready period, the oscillator OSC3 periodically (for example, for every few ms) generates the enable signal EN and drives the temperature sensor 106. The oscillator OSC2 is driven by the enable signal EN and outputs the clock signal CLK2 to the sequencer 106k and the successive approximation register 106b in order to generate the temperature code. Accordingly, even during the ready period of the memory 100, the temperature code is generated, and the temperature code stored in the successive approximation register 106b is updated.

Figure 7A:
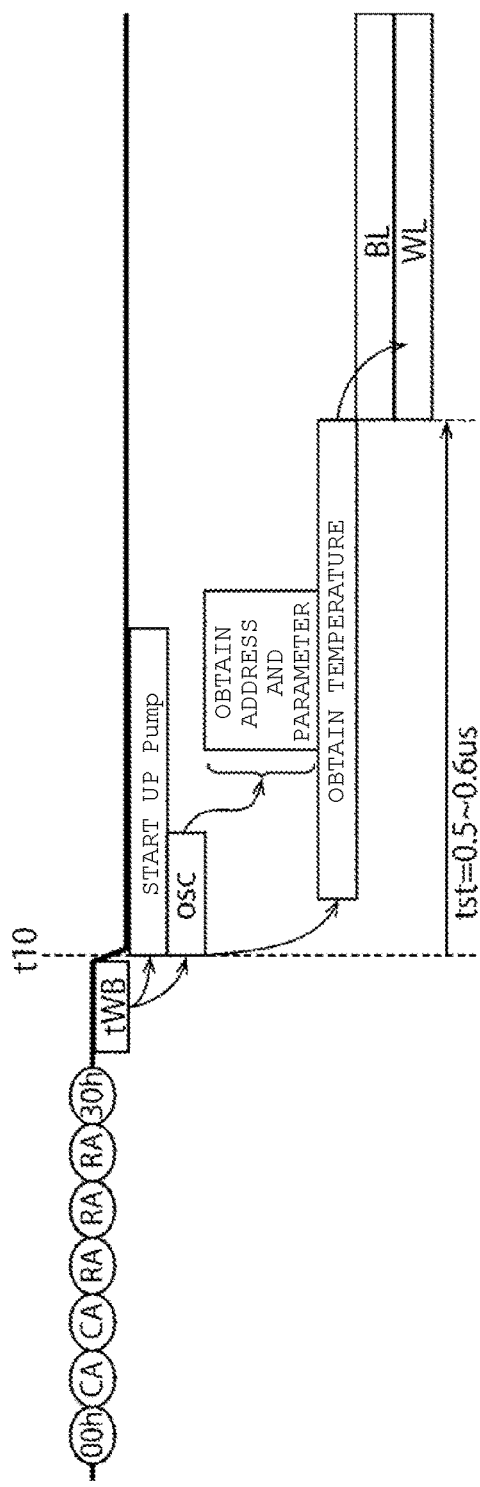
FIGS. 7A and 7B are timing charts illustrating an update of the temperature code according to a reference example and the first embodiment.

FIG. 7A is a timing chart as a reference example when the temperature code is updated after the memory 100 enters the busy state of the read operation. As described above, when the temperature code is updated after the memory 100 enters the busy state, the oscillator OSC1 in FIG. 1 starts generating the clock signal CLK1 after the memory 100 is selected and enters the busy state.

At time t10 in FIG. 7A, when the control circuit 105 receives a series of commands from the memory controller 200, the memory 100 enters the busy state. When the memory 100 enters the busy state, the oscillator OSC1 starts up, and a charge pump (not illustrated) increases the power supply voltage to a desired voltage. By the start-up of the oscillator OSC1, the control circuit 105 receives a block address, a word line address, and a parameter necessary for driving the memory cell array 110 from the memory controller 200.

Furthermore, the temperature sensor 106 starts up and generates and stores the temperature code. At this point, the voltage of the word line WL appropriate for the data read operation cannot be accurately set before the temperature code is obtained. Accordingly, the voltage of the word line WL is applied after the temperature code is obtained. In this case, a read setup time tst from entering the busy state until the read operation can be performed by applying the voltage to the word line WL is 0.5 µs to 0.6 µs. That is, when the temperature code is updated after the memory 100 enters the busy state, the memory 100 cannot read data before the read setup time tst.

Figure 7B:
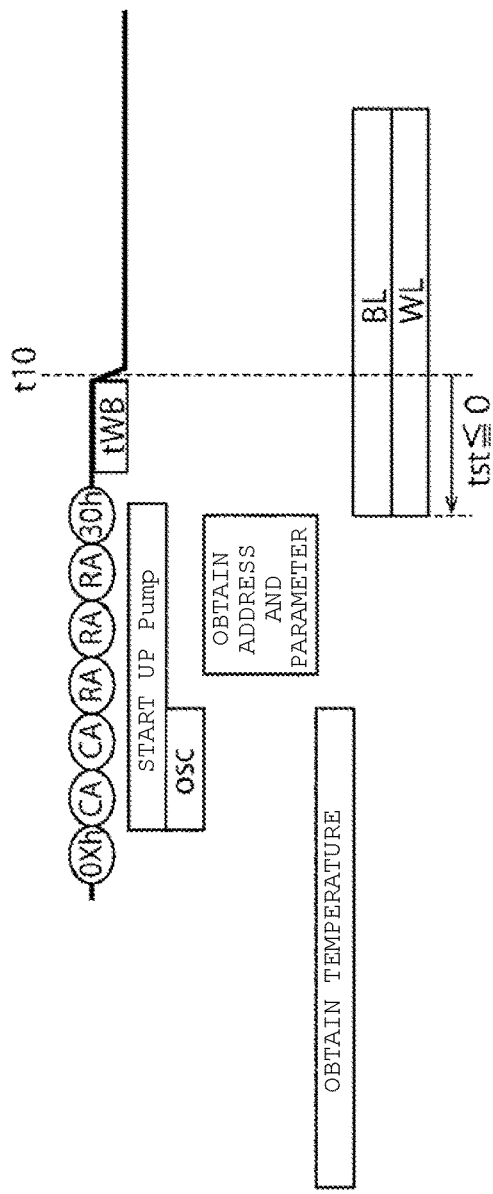

Meanwhile, FIG. 7B is a timing chart illustrating the update (auto-refresh) of the temperature code in the ready state of the memory 100 according to the first embodiment. In the present embodiment, even in the ready state before entering the busy state, the temperature sensor 106 periodically updates the temperature code. Since the temperature sensor 106 performs the auto-refresh even in the ready state, the voltage of the word line WL can be set using the temperature code previously obtained immediately before entering the busy state. In addition, in the present embodiment, the start-up of the charge pump, the start-up of the oscillator OSC1, and the reception of the block address, the word line address, and the parameter are performed during the period in which the series of commands is input. Accordingly, at t10 at which the memory 100 enters the busy state, the memory 100 is already in a state where the read operation can be performed. That is, the read setup time tst is less than or equal to 0, and data can be read without waiting after entering the busy state.

The memory 100 according to the present embodiment reduces or removes the waiting time after entering the busy state by setting the read setup time tst to be less than or equal to 0. Accordingly, the amount of time for reading data can be reduced.

The auto-refresh is periodically executed even in the ready state. Thus, an increase in current consumption is a concern, compared to the reference example. However, while the change in temperature of the memory cell array 110 depends on the material of the memory cell array 110 or the guaranteed temperature range of the environment in which the memory cell array 110 is used, the smallest change in temperature of the memory cell array 110 is approximately a few tens of ms/1° C. to a few hundred ms/1° C. In a case where the temperature code is updated when the temperature of the memory cell array 110 changes by 1° C. or more, the successive approximation register 106b may update the temperature code for at least every few tens of ms. That is, the enable signal EN may rise for at least every few tens of ms.

The amount of time for obtaining the temperature code is approximately a few µs and is significantly smaller than the cycle time of the enable signal EN. A current consumed for obtaining the temperature code once is a few mA. Even when the temperature code is obtained for each rising cycle of the enable signal EN, the amount of time for obtaining the temperature code is significantly smaller than the cycle time of the enable signal EN. Thus, the current consumption is merely approximately a few µA in average (a few mA×the amount of time for obtaining the temperature code (a few µs)/the rising cycle of the enable signal EN (a few ms)) during the cycle of the enable signal EN. Even when the rising cycle of the enable signal EN is set to, for example, ms as a practical worst case, the average current consumption required during the cycle for obtaining the temperature code is approximately 1 µA. Such a current consumption is significantly smaller than the current consumption of the memory 100. If the rising cycle of the enable signal EN is set to a value larger than 5 ms, the resulting average current consumption further decreases. Accordingly, the auto-refresh does not significantly increase the current consumption.

Consequently, the memory 100 according to the present embodiment can increase the speed of the read operation while reducing an increase in current consumption in the ready state.

Second Embodiment

Figure 8:
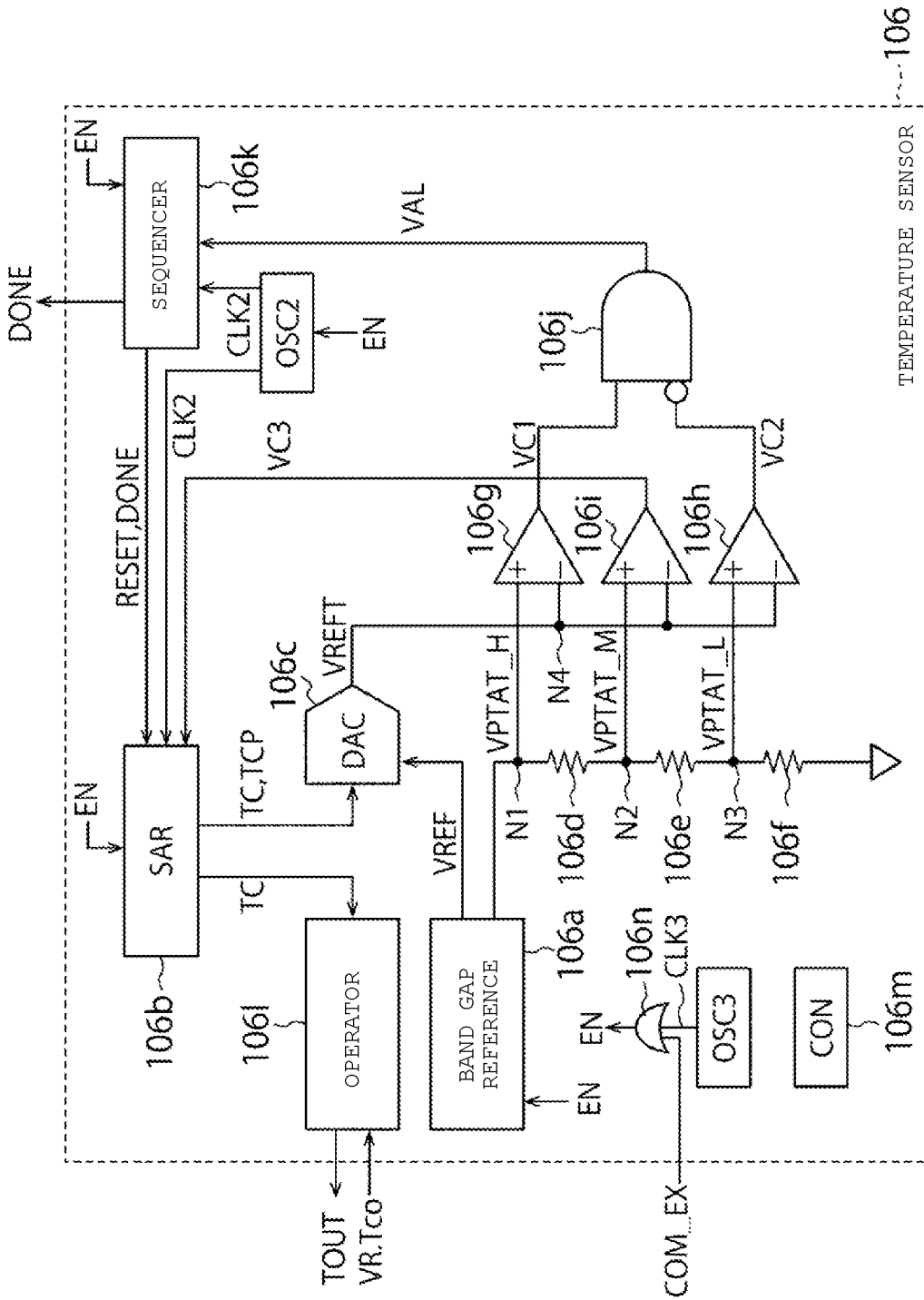
FIG. 8 is a block diagram illustrating one example of an internal configuration of a temperature sensor according to a second embodiment.

FIG. 8 is a block diagram illustrating one example of an internal configuration of the temperature sensor 106 according to a second embodiment. The temperature sensor 106 according to the second embodiment obtains the temperature code based on not only a clock signal CLK3 from the oscillator OSC3 but also an external command COM_EX as a second command. The external command COM_EX is registered in advance in the register 104 through the memory controller 200 and is transmitted to the temperature sensor 106 from the register 104 at a predetermined timing.

The temperature sensor 106 further includes an operation circuit 106n. The operation circuit 106n receives the clock signal CLK3 from the oscillator OSC3 and the external command COM_EX set by a user and outputs the result of a logical sum operation of the clock signal CLK3 and the external command COM_EX as the enable signal EN. The enable signal EN is used for the start-up of the temperature sensor 106 in the same manner as that of the first embodiment. The operation circuit 106n is the logical sum operation circuit and causes the enable signal EN to rise even when any of the clock signal CLK3 or the external command COM_EX rises. Accordingly, in the ready state, the temperature sensor 106 according to the second embodiment executes the auto-refresh based on the clock signal CLK3 from the oscillator OSC3 and generates and refreshes the temperature code corresponding to the temperature of the memory cell array 110 based on the external command COM_EX set by the user. The successive approximation register 106b updates the previously stored temperature code to a new temperature code. Accordingly, either the refresh based on the external command COM_EX or the auto-refresh in the ready state may be executed by one common temperature sensor 106. That is, a portion of the temperature sensor 106 is shared in the generation of the temperature code based on the external command COM_EX and the generation of the temperature code based on the clock signal CLK3 in the ready state.

Figure 9:
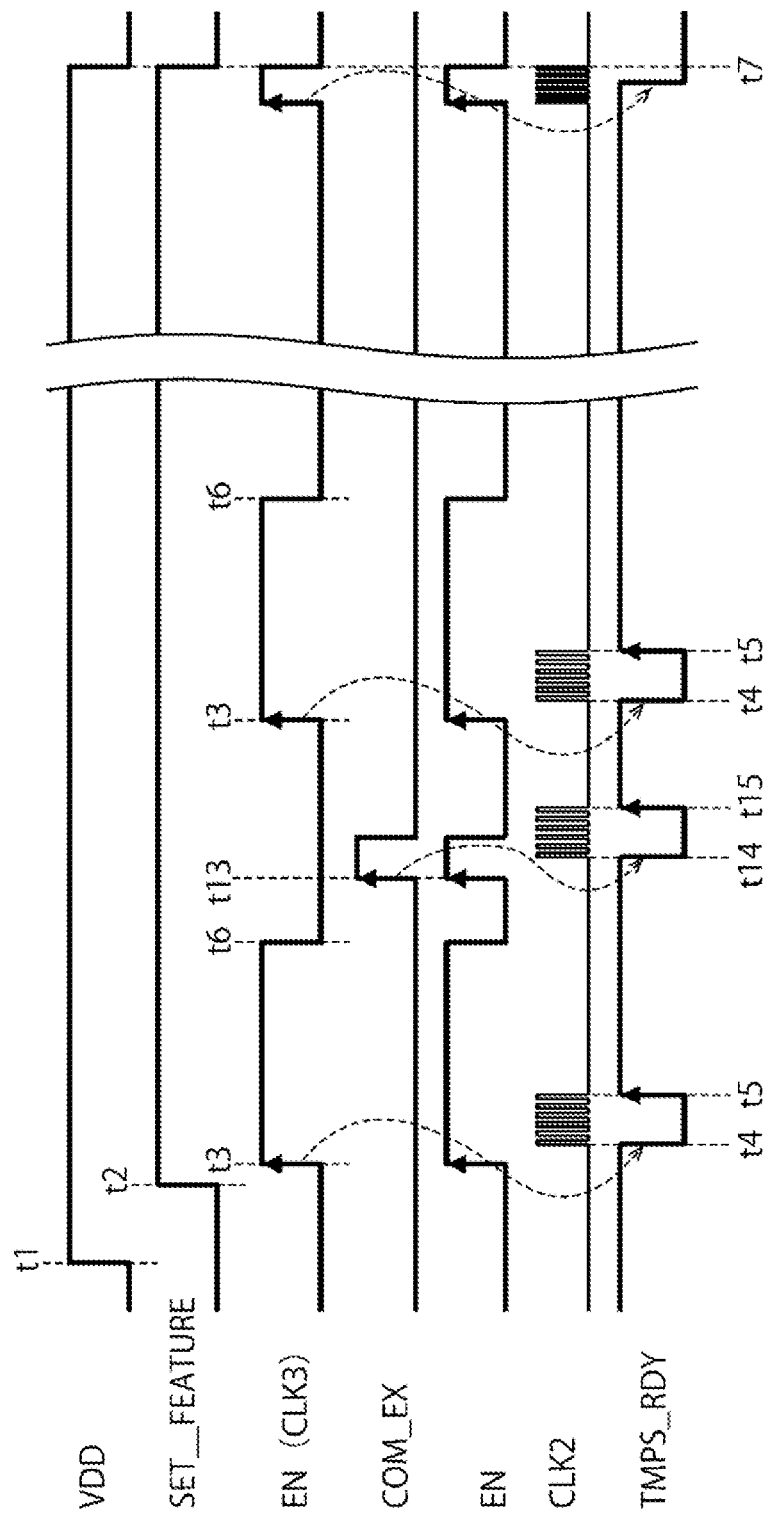
FIG. 9 is a timing chart illustrating a read operation of the temperature sensor according to the second embodiment.

FIG. 9 is a timing chart illustrating a read operation of the temperature sensor 106 according to the second embodiment. The operation at t1 to t7 may be the same as the operation at t1 to t7 in the first embodiment (as shown in FIG. 6). At this point, the enable signal EN and the clock signal CLK3 execute the same operation.

At t13, the external command COM_EX rises and accompanies a rise of the enable signal EN. Accordingly, at t14 to t15, the refresh is executed. In such a manner, in the second embodiment, the refresh is executed at not only the rise timing of the clock signal CLK3 from the oscillator OSC3, but also the rise timing of the external command COM_EX set by the user. Accordingly, the refresh can be executed at any timing desired by the user.

Both of the clock signal CLK3 and the external command COM_EX may be driven, or only one of the clock signal CLK3 and the external command COM_EX may be selectively driven.

In addition, when the refresh based on the external command COM_EX is executed after a certain clock signal CLK3, the temperature sensor 106 may not execute the auto-refresh in the subsequent clock signal CLK3. The reason is that since the temperature code is updated by the external command COM_EX after the clock signal CLK3, the update of the temperature code based on the subsequent clock signal CLK3 is not necessary, and a surplus power consumption is reduced.

Third Embodiment

Figure 10:
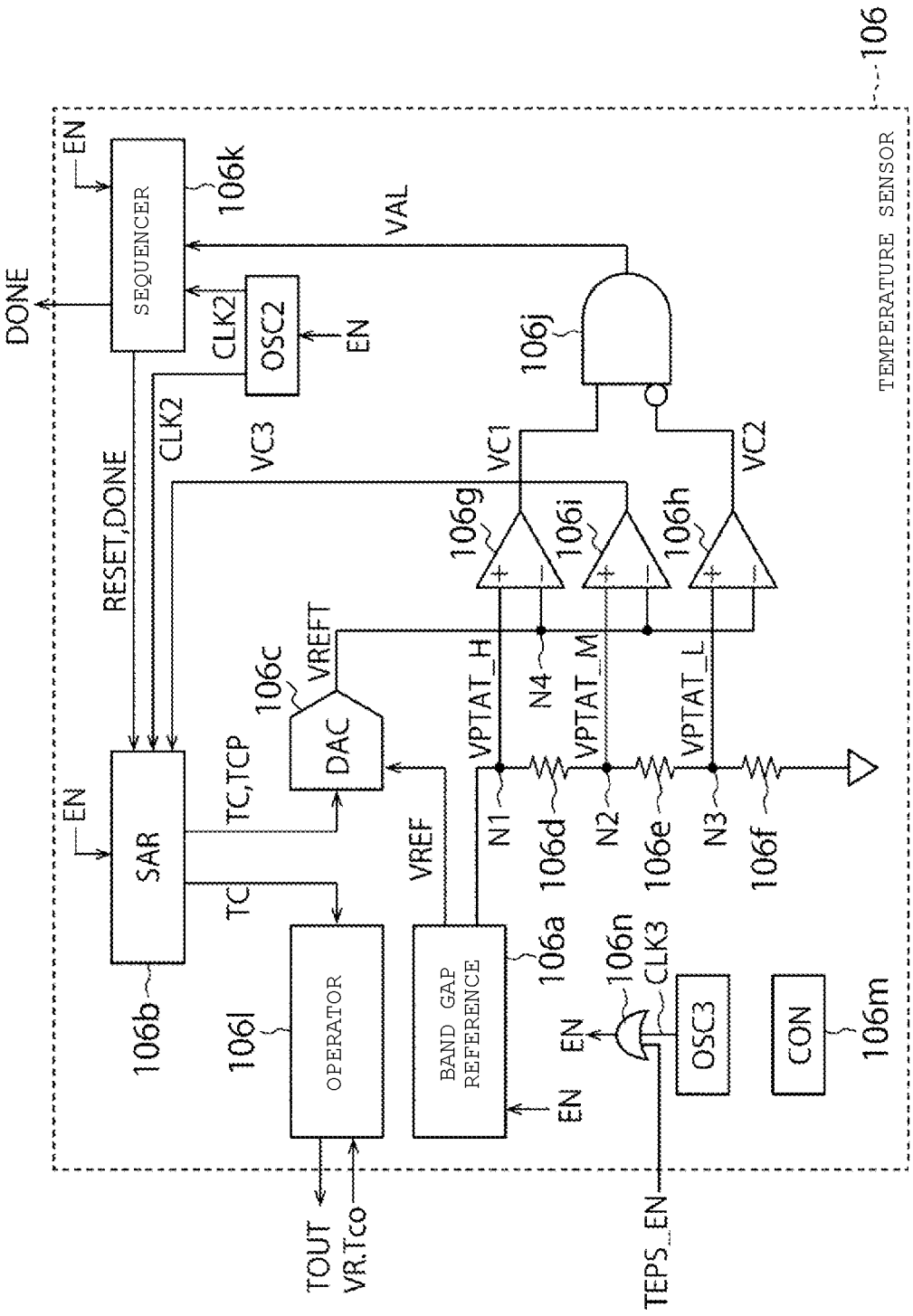
FIG. 10 is a block diagram illustrating one example of an internal configuration of a temperature sensor according to a third embodiment.

FIG. 10 is a block diagram illustrating one example of an internal configuration of the temperature sensor 106 according to a third embodiment. The temperature sensor 106 according to the third embodiment obtains the temperature code based on not only the clock signal CLK3 from the oscillator OSC3 but also a busy signal TMPS_EN from the control circuit 105. The busy signal TMPS_EN as a third command permits access to the memory cell array 110. That is, even when the memory 100 enters the busy state, the temperature sensor 106 obtains the temperature code. For example, when the memory 100 receives the read enable signal RE, the oscillator OSC1 in FIG. 1 is driven, and the control circuit 105 starts up. Accordingly, the control circuit 105 enters a state where the busy signal TMPS_EN can be output.

The operation circuit 106n of the temperature sensor 106 receives the clock signal CLK3 from the oscillator OSC3 and the busy signal TMPS_EN from the control circuit 105 and outputs the result of a logical sum operation of the clock signal CLK3 and the busy signal TMPS_EN as the enable signal EN. The enable signal EN is used for the start-up of the temperature sensor 106 in the same manner as that of the first embodiment. The operation circuit 106n is the logical sum operation circuit and causes the enable signal EN to rise even when any of the clock signal CLK3 or the busy signal TMPS_EN rises. Accordingly, in the ready state, the temperature sensor 106 according to the third embodiment executes the auto-refresh based on the clock signal CLK3 from the oscillator OSC3. When the memory 100 enters the busy state, the temperature sensor 106 generates and refreshes the temperature code corresponding to the temperature of the memory cell array 110 based on the busy signal TMPS_EN as the third command. The successive approximation register 106b updates the previously stored temperature code to a new temperature code. Accordingly, either the refresh based on the busy signal TMPS_EN or the auto-refresh in the ready state may be executed by one common temperature sensor 106. That is, a portion of the temperature sensor 106 is shared in the generation of the temperature code based on the busy signal TMPS_EN and the generation of the temperature code based on the clock signal CLK3 in the ready state. The auto-refresh based on the clock signal CLK3 may be executed even in the busy state.

Figure 11:
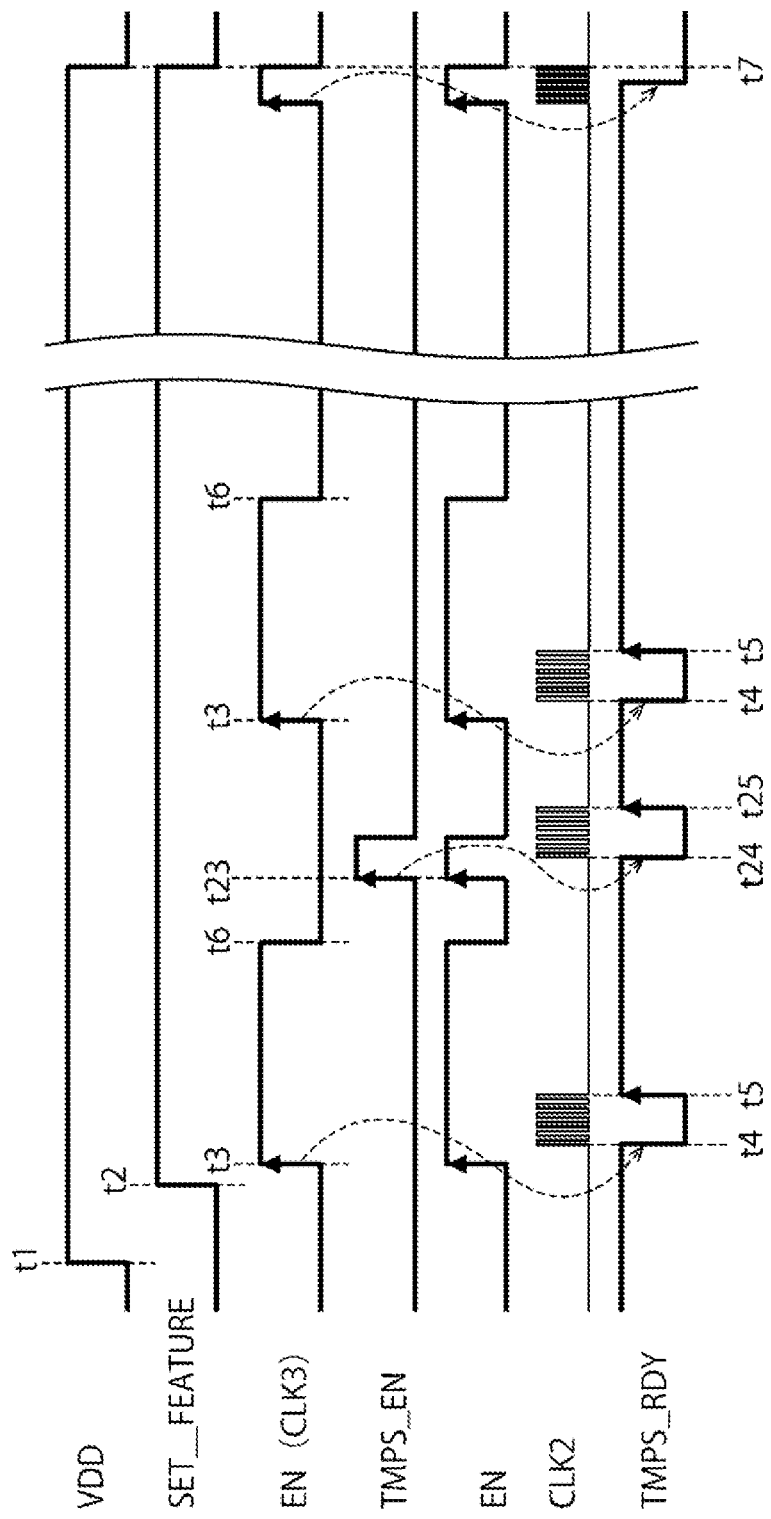
FIG. 11 is a timing chart illustrating a read operation of the temperature sensor according to the third embodiment.

FIG. 11 is a timing chart illustrating a read operation of the temperature sensor 106 according to the third embodiment. The operation at t1 to t7 may be the same as the operation at t1 to t7 in the first embodiment (as shown in FIG. 6). At this point, the enable signal EN and the clock signal CLK3 execute the same operation.

At t23, the busy signal TMPS_EN rises and accompanies a rise of the enable signal EN. Accordingly, at t24 to t25, the refresh of the temperature code is executed. In such a manner, in the third embodiment, the refresh of the temperature code is executed at not only the rise timing of the clock signal CLK3 from the oscillator OSC3 but also the rise timing of the busy signal TMPS_EN from the memory 100.

After the refresh of the temperature code, the voltage generation circuit 107 generates a voltage to be applied to the memory cell array 110 based on the temperature code stored in the successive approximation register 106b.

Along with the busy signal TMPS_EN, both of the clock signal CLK3 and the external command COM_EX may be driven, or only one of the clock signal CLK3 and the external command COM_EX may be selectively driven.

In addition, when the refresh based on the busy signal TMPS_EN is executed after a certain clock signal CLK3, the temperature sensor 106 may not execute the auto-refresh in the subsequent clock signal CLK3. The reason is that since the temperature code is updated by the busy signal TMPS_EN after the clock signal CLK3, the update of the temperature code based on the subsequent clock signal CLK3 is not necessary, and a surplus power consumption is reduced.

In addition, the second and third embodiments may be combined. That is, the operation circuit 106n may receive the clock signal CLK3, the external command COM_EX, and the busy signal TMPS_EN and output the result of a logical sum operation of the clock signal CLK3, the external command COM_EX, and the busy signal TMPS_EN as the enable signal EN. Accordingly, while the auto-refresh based on the clock signal CLK3 is executed, the temperature code can be updated when the memory 100 enters the busy state or based on the setting made by the user.

Modification Example

In the third embodiment, the temperature code may be frequently updated when the enable signal EN rises in both of the clock signal CLK3 and the busy signal TMPS_EN. In this case, the current consumption may be increased. In order to deal with such a case, when the busy signal TMPS_EN rises and the temperature code is updated, the oscillator OSC3 may be reset at the time of obtaining the temperature code based on the busy signal TMPS_EN and start outputting the clock signal CLK3 after the temperature code is obtained. Accordingly, excessive updates of the temperature code can be avoided, and an increase in current consumption can be reduced.

Figure 12:
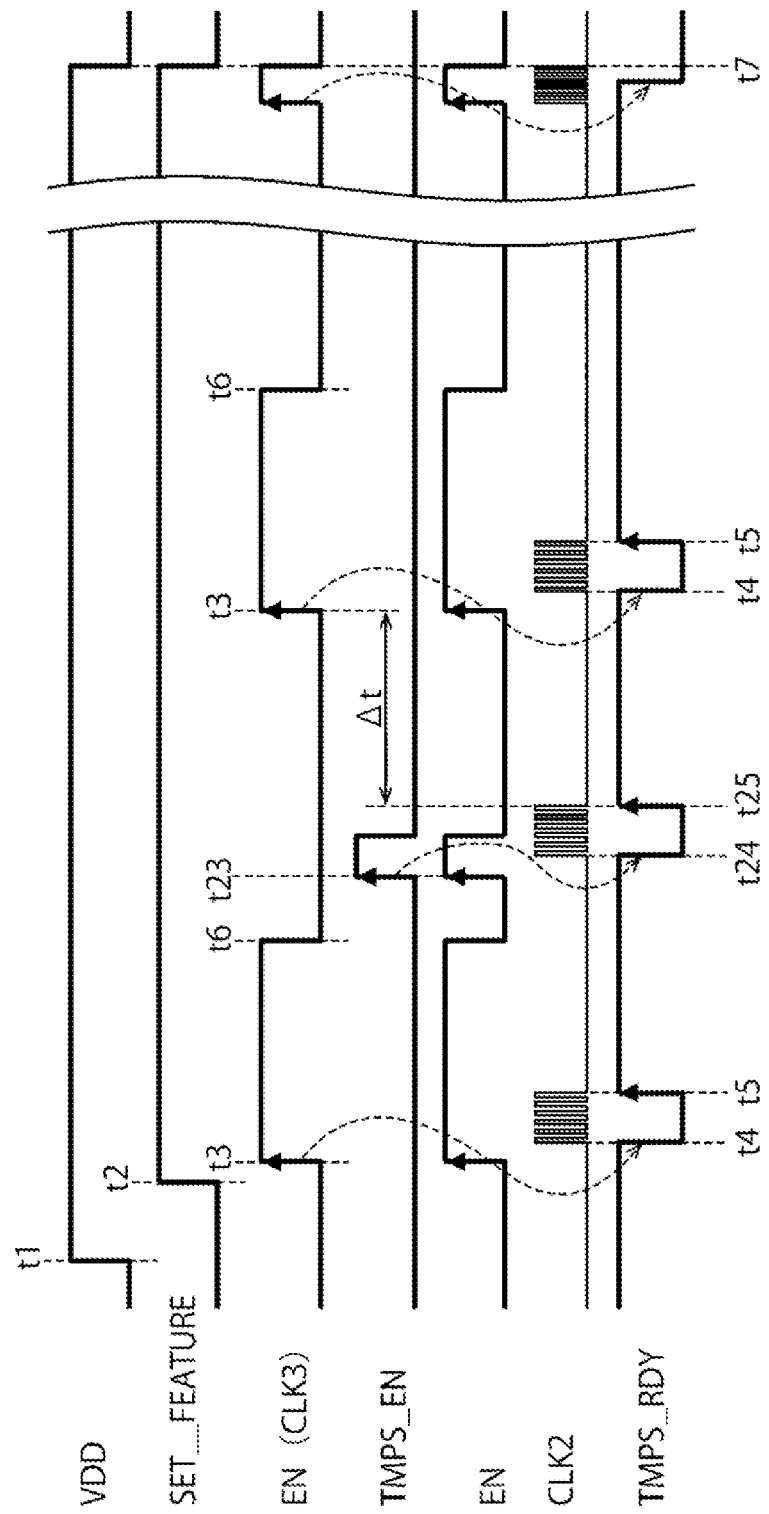
FIG. 12 is a timing chart illustrating a read operation of a temperature sensor according to a modification example.

For example, FIG. 12 is a timing chart illustrating a read operation of the temperature sensor 106 according to the modification example. The timing chart in FIG. 12 is basically the same as the timing chart in FIG. 11. However, after the refresh of the temperature code based on the rise of the busy signal TMPS_EN at t23 to t25 is executed, the oscillator OSC3 is reset at time t25 at which the signal TMPS_RDY rises and the temperature sensor 106 enters the ready state. Accordingly, the oscillator OSC3 starts outputting the clock signal CLK3 from t25. That is, the clock signal CLK3 rises after a half cycle Δt (for example, 0.25 ms) of the clock signal CLK3 from t25. Then, the clock signal CLK3 rises at each cycle (cycle of ½₀ of the rising cycle of the enable signal EN; for example, 0.5 ms).

Accordingly, excessive updates of the refresh of the temperature code can be reduced, and an increase in current consumption can be reduced.

In the present modification example, the reset of the oscillator OSC3 is triggered by the rise of the busy signal TMPS_RDY of the temperature sensor 106. However, the reset of the oscillator OSC3 may be triggered by the rise or fall of the busy signal TMPS_EN.

In addition, the present modification example may be applied to the second embodiment. That is, the reset of the oscillator OSC3 may be triggered by the rise of the busy signal TMPS_RDY of the temperature sensor 106 at t15 in FIG. 9. Furthermore, the reset of the oscillator OSC3 may be triggered by the rise or fall of the external command COM_EX in FIG. 9.

Figure 13:
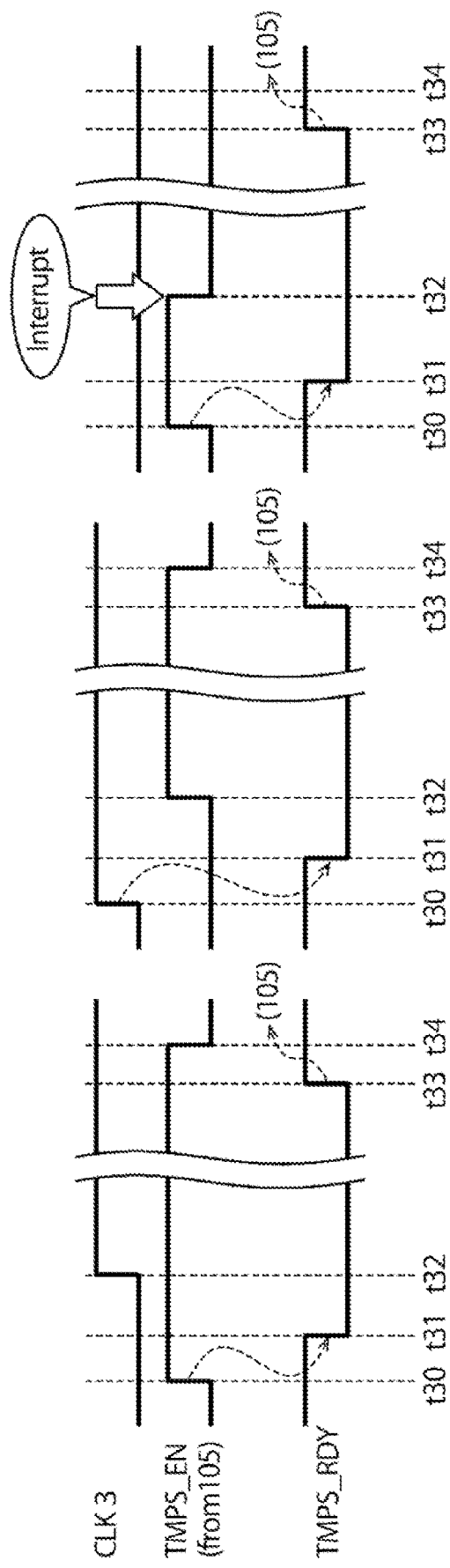
FIG. 13 depicts timing charts when a clock signal in a ready state overlaps with a signal indicating a busy state.

FIG. 13 depicts timing charts when the clock signal CLK3 in the ready state of the memory 100 overlaps with the signal TMPS_RDY indicating the busy state of the memory 100.

For example, as illustrated in left side portion of FIG. 13, at time t30, when the memory 100 enters the busy state, the busy signal TMPS_EN from the control circuit 105 rises. Accordingly, at t31, the signal TMPS_RDY falls, and the temperature sensor 106 starts up and enters the busy state. The temperature sensor 106 generates the temperature code at t31 to t33.

However, at t32 (during the generation of the temperature code) between t31 and t33, the clock signal CLK3 rises. In this case, the generation of the temperature code based on the busy signal TMPS_EN continues, and the generation of the temperature code based on the clock signal CLK3 is not executed. That is, even when the clock signal CLK3 is received during the generation of the temperature code based on the busy signal TMPS_EN, the temperature sensor 106 generates the temperature code based on the busy signal TMPS_EN. The temperature code generated at this point is stored in the successive approximation register 106b.

Then, after the generation and obtaining of the temperature code based on the busy signal TMPS_EN are complete, the signal TMPS_RDY rises at t33, and the busy signal TMPS_EN falls at t34. By returning the rising TMPS_RDY signal to the control circuit 105, the control circuit 105 enters a state where the subsequent busy signal TMPS_EN can be received. In order to reduce a surplus power consumption by recognizing the update of the temperature code based on the busy signal TMPS_EN, the cycle time of the subsequent clock signal CLK3 may be reset as described above.

For example, as illustrated in the middle portion of FIG. 13, when the clock signal CLK3 rises at time t30, the rise of the clock signal CLK3 accompanies a fall of the signal TMPS_RDY at t31, and the temperature sensor 106 starts up and enters the busy state. The temperature sensor 106 generates the temperature code at t31 to t33.

However, at t32 (during the generation of the temperature code) between t31 and t33, the busy signal TMPS_EN from the control circuit 105 rises. In this case, the generation of the temperature code based on the clock signal CLK3 continues, and the generation of the temperature code based on the busy signal TMPS_EN is not executed. That is, even when the busy signal TMPS_EN is received during the generation of the temperature code based on the clock signal CLK3, the temperature sensor 106 generates the temperature code based on the clock signal CLK3. The temperature code generated at this point is stored in the successive approximation register 106b.

Then, after the generation and obtaining of the temperature code based on the busy signal TMPS_EN are complete, the signal TMPS_RDY rises at t33, and the busy signal TMPS_EN falls at t34. By returning the rising TMPS_RDY signal to the control circuit 105, the control circuit 105 enters a state where the subsequent busy signal TMPS_EN can be received. In order to reduce a surplus power consumption by recognizing the update of the temperature code based on the busy signal TMPS_EN, the cycle time of the subsequent clock signal CLK3 may be reset as described above.

In such a manner, even when the clock signal CLK3 in the ready state of the memory 100 overlaps with the signal TMPS_RDY indicating the busy state of the memory 100, the temperature sensor 106 does not stop and continues generating the temperature code until the completion of the update.

Even when the clock signal CLK3 overlaps with the external command COM_EX, the temperature sensor 106 does not stop and continues generating the temperature code until the completion of the update. For example, even when the clock signal CLK3 is received during the generation of the temperature code based on the external command COM_EX, the temperature sensor 106 continuously generates the temperature code based on the external command COM_EX. The temperature code generated at this point is stored in the successive approximation register 106b.

Even when the external command COM_EX is received during the generation of the temperature code based on the clock signal CLK3, the temperature sensor 106 continuously generates the temperature code based on the clock signal CLK3. The temperature code generated at this point is stored in the successive approximation register 106b.

For example, as illustrated in the right side portion of FIG. 13, at time t30, when the memory 100 enters the busy state, the busy signal TMPS_EN from the control circuit 105 rises. Accordingly, at t31, the signal TMPS_RDY falls, and the temperature sensor 106 starts up and enters the busy state. The temperature sensor 106 generates the temperature code from t31.

However, in the right side portion of FIG. 13, at t32, an interruption occurs, and the signal TMPS_EN falls during the generation of the temperature code. Even when the interruption occurs during the generation of the temperature code, the temperature sensor 106 according to the present embodiment continues generating the temperature code until the temperature code is updated.

Then, after the generation and obtaining of the temperature code based on the busy signal TMPS_EN are complete, the signal TMPS_RDY rises at t33, and the busy signal TMPS_EN falls at t34. By returning the rising TMPS_RDY signal to the control circuit 105, the control circuit 105 enters a state where the subsequent busy signal TMPS_EN can be received. In order to reduce a surplus power consumption by recognizing the update of the temperature code based on the busy signal TMPS_EN, the cycle time of the subsequent clock signal CLK3 may be reset as described above.

While the interruption to the busy signal TMPS_EN is illustrated in the right side portion of FIG. 13, the same applies to an interruption to the clock signal CLK3. Accordingly, even when the clock signal CLK3 falls during the generation of the temperature code based on the clock signal CLK3, the temperature sensor 106 according to the present embodiment continues generating the temperature code until the temperature code is updated.

In such a manner, even when the busy signal TMPS_EN or the clock signal CLK3 is interrupted during the generation of the temperature code, the temperature sensor 106 does not stop and continues generating the temperature code until the completion of the update and a fall of the power supply voltage.

The updated temperature code is used when the memory 100 enters the busy state by the subsequent busy signal TMPS_EN. Accordingly, the voltage generation circuit 107 can set a voltage to be applied to the memory cell array 110 using the relatively recently updated temperature code. Consequently, the voltage generation circuit 107 can apply a voltage appropriate for the temperature of the memory cell array 110.

Configuration of Memory Package

Figure 14:
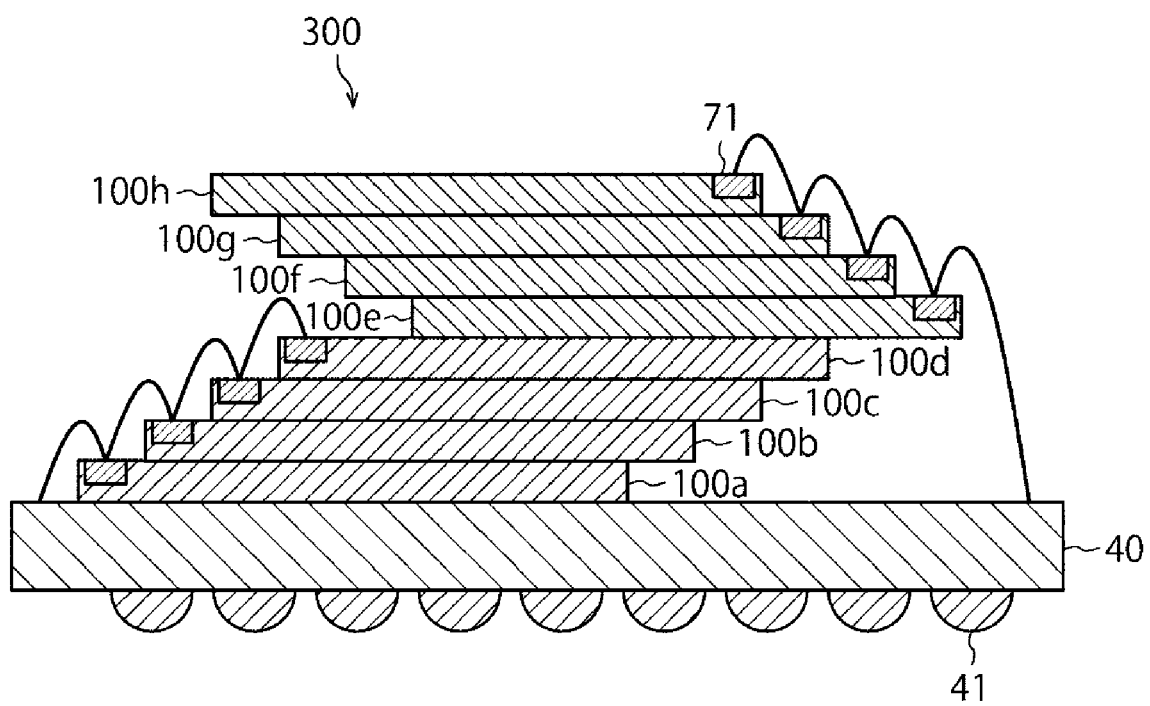
FIG. 14 is a cross-sectional view illustrating one example of an internal configuration of a memory package according to the present embodiment.

FIG. 14 is a cross-sectional view illustrating one example of an internal configuration of a memory package 300 according to the present embodiment. The memory package 300 includes a package substrate 40 and eight memories (memory chips) 100 (100a to 100h). For example, the plurality of memories 100 are sealed with molding resin (not illustrated) on the package substrate 40. In FIG. 14, the memory controller 200 in FIG. 1 is not illustrated. In addition, while eight memories 100 are stacked on top of each other, the number of stacked memories 100 is not limited to eight and can be appropriately changed. Each memory 100 includes a plurality of terminals 71 for communicating signals to the outside of the memory 100 (memory controller 200 and the like).

For example, the memories 100a to 100h are stacked in order from a lower side on the upper surface of the package substrate 40 in a state where the centers of the memories 100a to 100h deviate from each other in a step shape to expose the terminals 71. For example, the terminals 71 of each memory 100 are electrically connected to the package substrate 40 through gold wiring.

The memory 100 in FIG. 1 may be any of the memories 100a to 100h or may be considered to correspond to the whole memories 100a to 100h.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a memory cell array associated with a bit line and a word line;
a row decoder configured to drive the word line;
a sense circuit configured to sense data read into the bit line from the memory cell array;
a voltage generation circuit configured to generate a voltage to be applied to the row decoder and the sense circuit;
a control circuit configured to receive a series of commands from an external memory controller and to perform an operation in response to the series of commands, the control circuit including a first oscillator which is activated upon receipt of the series of commands and generates a first clock signal having first intervals; and
a temperature sensor including
a second oscillator which generates a second clock signal having the first intervals, and
a third oscillator which generates a third clock signal having second intervals longer than the first intervals, and
a storage circuit,
the temperature sensor being configured to generate a temperature signal corresponding to a temperature of the memory cell array using the second oscillator, and cause the storage circuit to store the temperature signal,
the second oscillator being activated in response to an enable signal sent from the control circuit when the control circuit starts the operation, and in response to the third clock signal;
wherein, during the operation performed by the control circuit, the voltage generation circuit generates a voltage to be applied to the row decoder and the sense circuit based on the temperature signal stored in the storage circuit.

2. The semiconductor storage device according to claim 1, wherein, when the semiconductor storage device is in a ready state,
the first oscillator is deactivated,
the second oscillator is deactivated, and
the third oscillator is activated.

3. The semiconductor storage device according to claim 1, wherein
the second oscillator is further configured to be activated in response to data indicating that the semiconductor storage device has changed from a ready state to a busy state.

4. The semiconductor storage device according to claim 3, wherein
the temperature sensor resets the third oscillator in response to the enable signal sent from the control circuit when the control circuit starts the operation, or in response to the data indicating that the semiconductor storage device has changed from the ready state to the busy state.

5. A method of generating a voltage in a semiconductor storage device that includes a memory cell array associated with a bit line and a word line, a row decoder configured to drive the word line, a sense circuit configured to sense data read into the bit line from the memory cell array, a voltage generation circuit configured to generate a voltage to be applied to the row decoder and the sense circuit, a control circuit configured to receive a series of commands from an external memory controller and to perform an operation in response to the series of commands, the control circuit including a first oscillator which is activated upon receipt of the series of commands and generates a first clock signal having first intervals, and a temperature sensor including a second oscillator which generates a second clock signal having the first intervals, a third oscillator which generates a third clock signal having second intervals longer than the first intervals, and a storage circuit, the method comprising:
receiving by the temperature sensor, a first command periodically during a waiting period of the memory cell array; and
each time the first command is received during the waiting period, generating by the temperature sensor, a temperature signal corresponding to a temperature of the memory cell array using the second oscillator, and storing by the temperature sensor, the temperature signal in the storage circuit, the second oscillator being activated in response to an enable signal sent from the control circuit when the control circuit starts the operation, and in response to the third clock signal, wherein during the operation performed by the control circuit, the voltage generation circuit generates a voltage to be applied to the row decoder and the sense circuit based on the temperature signal stored in the storage circuit.

6. The method according to claim 5, further comprising:
when the semiconductor storage device is in a ready state, deactivating the first oscillator, deactivating the second oscillator, and activating the third oscillator.

7. The method according to claim 5, further comprising:
activating the second oscillator in response to data indicating that the semiconductor storage device has changed from a ready state to a busy state.

8. The method according to claim 7, further comprising:
resetting the third oscillator by the temperature sensor in response to the enable signal sent from the control circuit when the control circuit starts the operation, or in response to the data indicating that the semiconductor storage device has changed from the ready state to the busy state.

* * * * *